United States Patent
Leem

(10) Patent No.: US 11,337,007 B2
(45) Date of Patent: May 17, 2022

(54) VOICE COIL PLATE HAVING MULTI-PATTERNED COIL, AND FLAT PANEL SPEAKER COMPRISING VOICE COIL PLATE HAVING MULTI-LAYERED STRUCTURE

(71) Applicant: iMusik Co., Ltd., Incheon (KR)

(72) Inventor: Sung Jin Leem, Seoul (KR)

(73) Assignee: iMusik Co., Ltd.

( * ) Notice: Subject to any disclaimer, the term of this patent is extended or adjusted under 35 U.S.C. 154(b) by 0 days.

(21) Appl. No.: 17/271,639

(22) PCT Filed: Aug. 30, 2019

(86) PCT No.: PCT/KR2019/011134
§ 371 (c)(1),
(2) Date: Feb. 26, 2021

(87) PCT Pub. No.: WO2020/046039
PCT Pub. Date: Mar. 5, 2020

(65) Prior Publication Data
US 2021/0337313 A1   Oct. 28, 2021

(30) Foreign Application Priority Data

Aug. 30, 2018   (KR) .................. 10-2018-0102406
Sep. 13, 2018   (KR) .................. 10-2018-0109449

(51) Int. Cl.
*H04R 9/04* (2006.01)
*H04R 1/02* (2006.01)
*H05K 1/16* (2006.01)

(52) U.S. Cl.
CPC .............. *H04R 9/047* (2013.01); *H04R 1/02* (2013.01); *H05K 1/16* (2013.01); *H04R 2209/041* (2013.01); *H04R 2400/11* (2013.01)

(58) Field of Classification Search
CPC .... H04R 9/047; H04R 1/02; H04R 2209/041; H04R 2400/11; H05K 1/16
See application file for complete search history.

(56) References Cited

U.S. PATENT DOCUMENTS

2013/0089232 A1* 4/2013 Kim ................... H04R 7/04
                                                381/431
2018/0295451 A1* 10/2018 Min ..................... H05K 3/4614

FOREIGN PATENT DOCUMENTS

KR   20110135468   12/2011
KR   20120000608   1/2012
(Continued)

*Primary Examiner* — Sunita Joshi
(74) *Attorney, Agent, or Firm* — The Belles Group, P.C.

(57) ABSTRACT

The present invention relates to a voice coil plate having a multi-patterned coil for a slim speaker, the voice coil plate enabling weight reduction, impedance value reduction and inductance value enhancement; and a slim flat speaker enabling weight reduction, impedance value reduction and inductance value enhancement. In one embodiment, the voice coil plate comprises: a base substrate; and a voice coil formed on one surface of the base substrate comprising: a first pattern part arranged along a first direction; and a second pattern part arranged along a second direction different from the first direction. The first pattern part comprises a plurality of first patterns spaced apart at predetermined intervals, and the second pattern part comprises a plurality of second patterns spaced apart at predetermined intervals. At least two of the second patterns, among the plurality of second patterns, are connected in parallel to one of the first patterns.

16 Claims, 17 Drawing Sheets

(56) References Cited

FOREIGN PATENT DOCUMENTS

| KR | 20120011769 | 2/2012 |
| KR | 101147904 | 5/2012 |
| KR | 20160128254 | 11/2016 |
| KR | 20170006126 | 1/2017 |

\* cited by examiner

[Fig. 1]
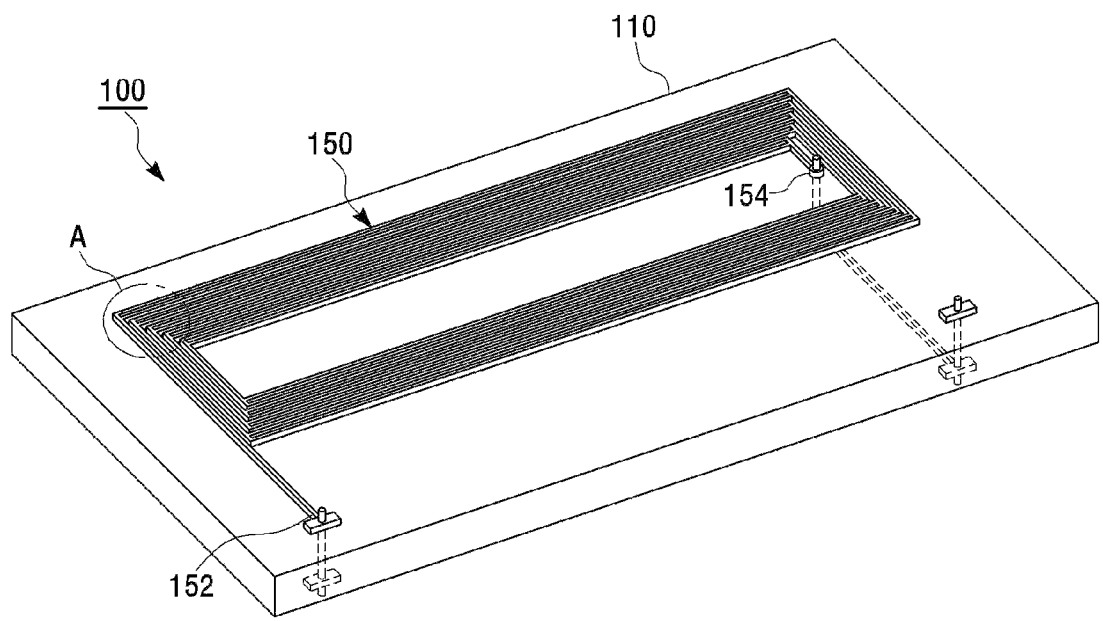
[Fig. 2]
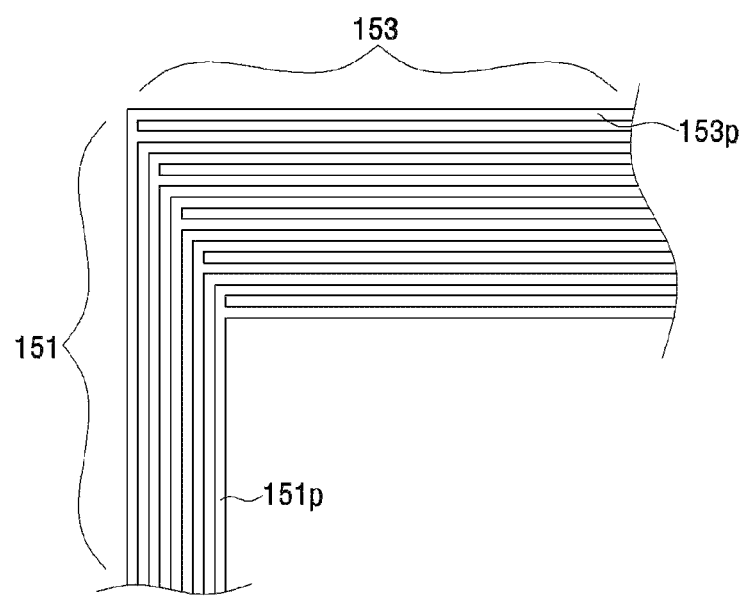

[Fig. 3]
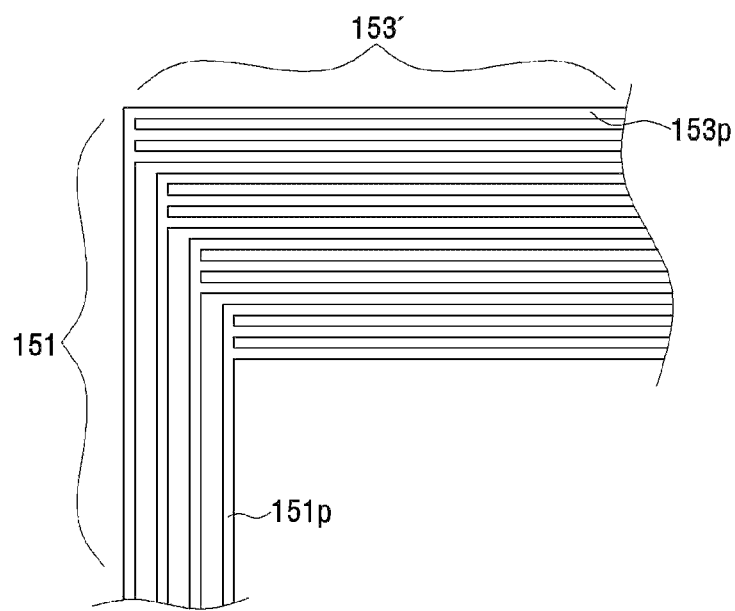
[Fig. 4]
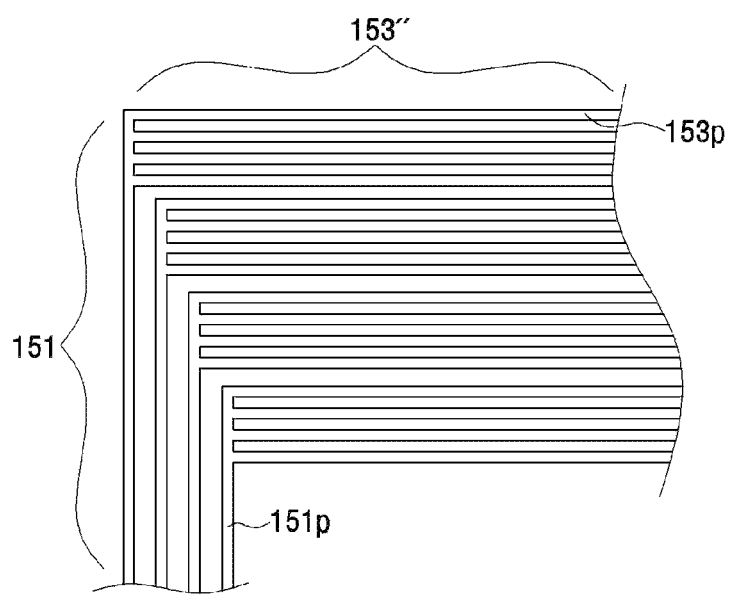

[Fig. 5a]
153
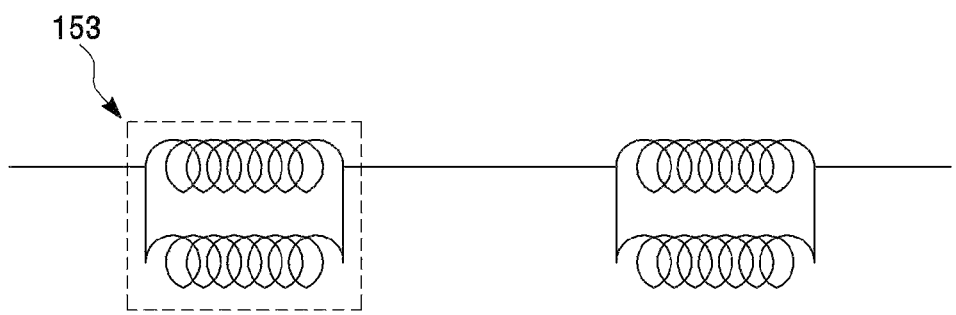
[Fig. 5b]
153″
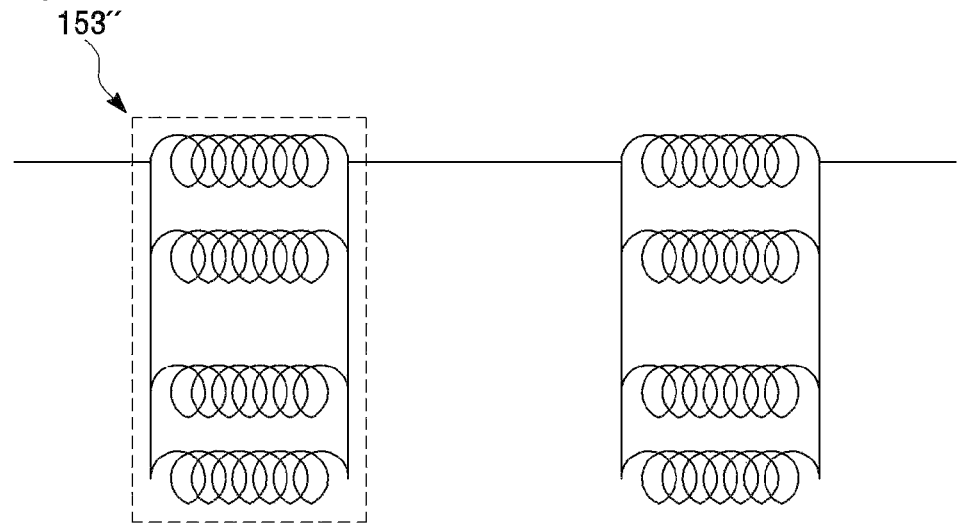

[Fig. 6]
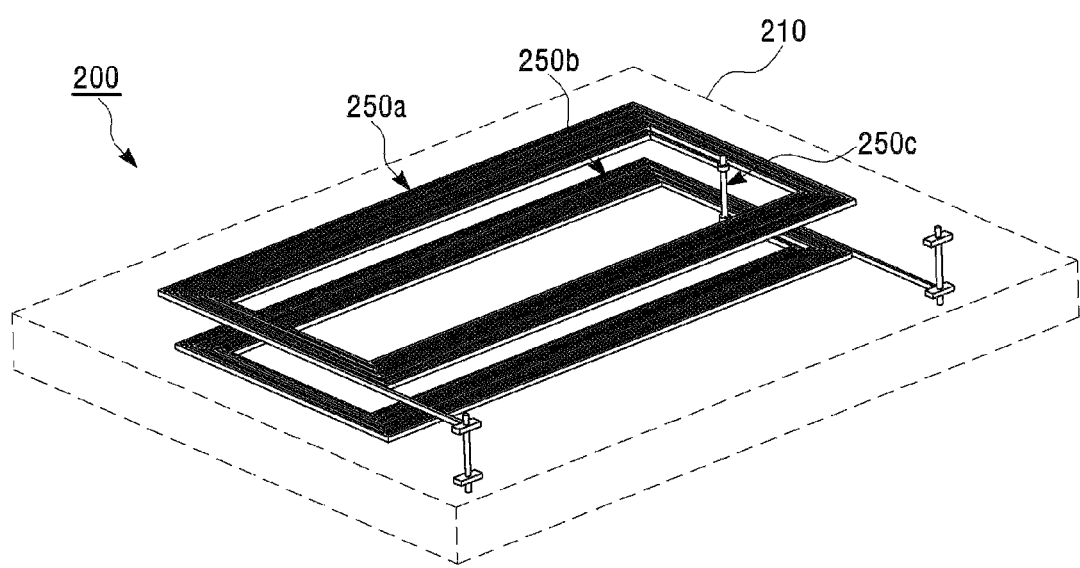

[Fig. 7a]
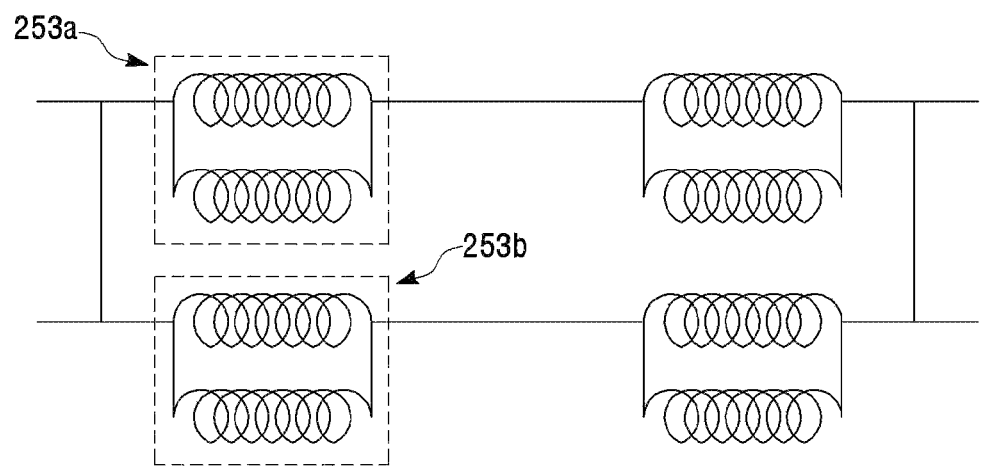
[Fig. 7b]
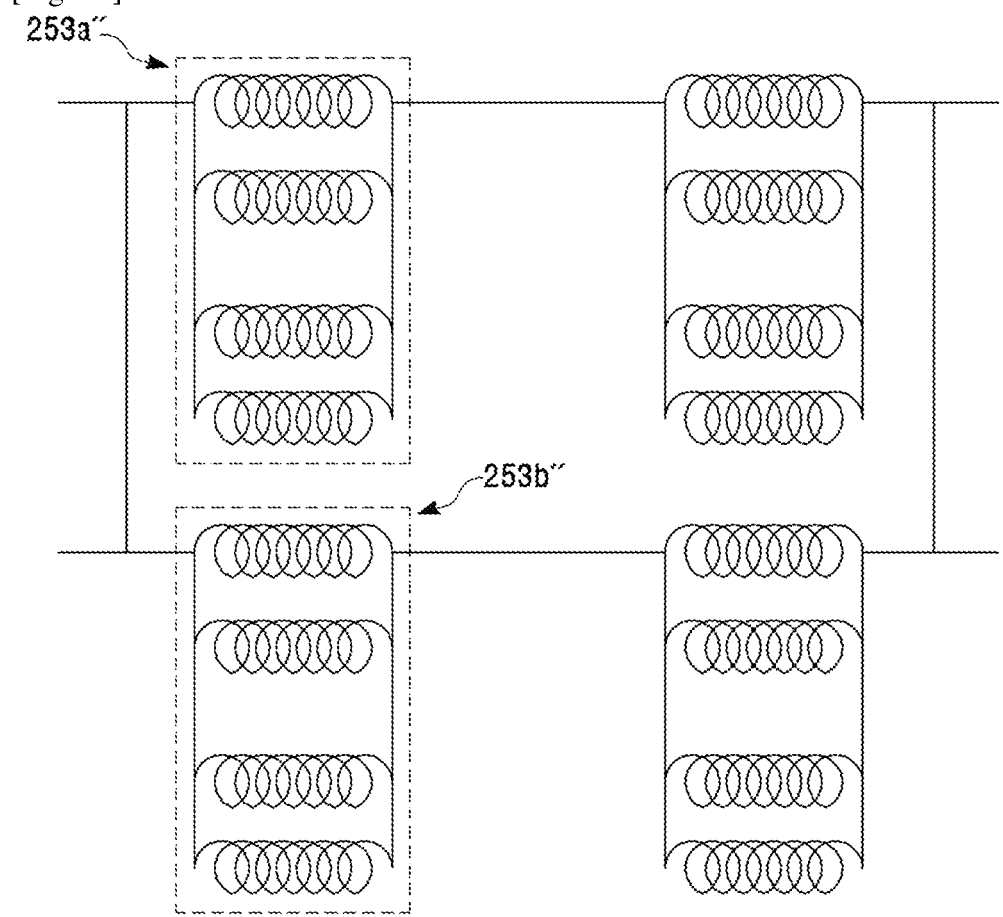

[Fig. 8]
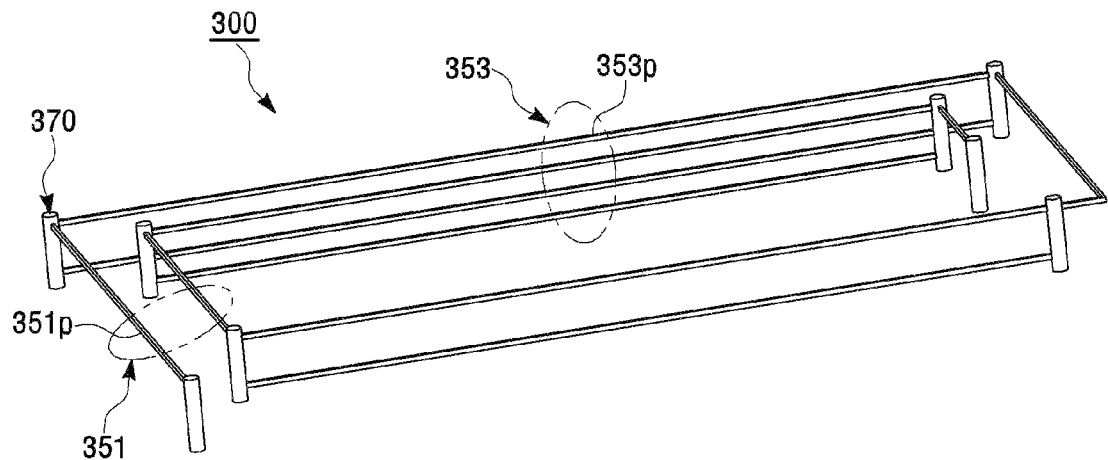
[Fig. 9]
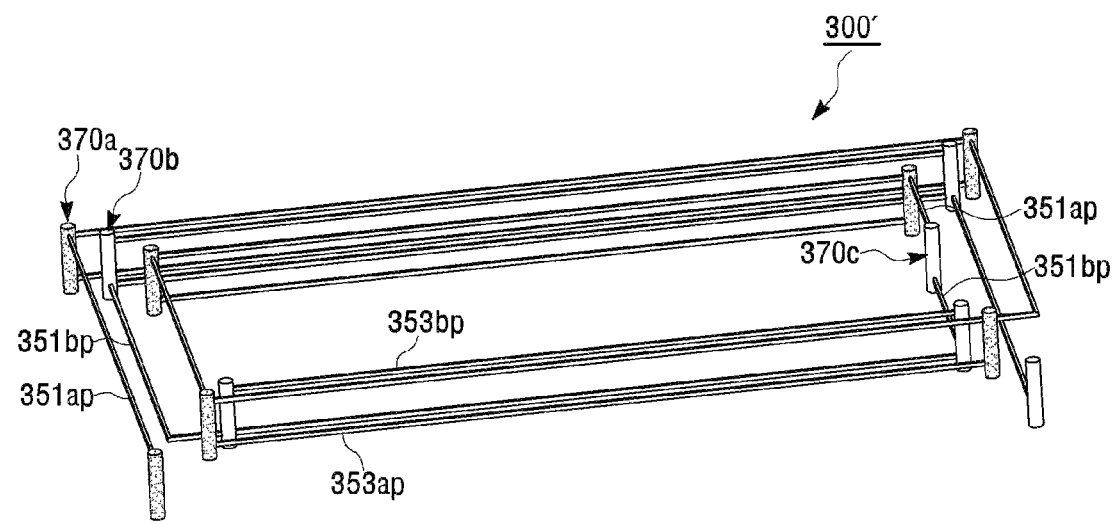

[Fig. 10]
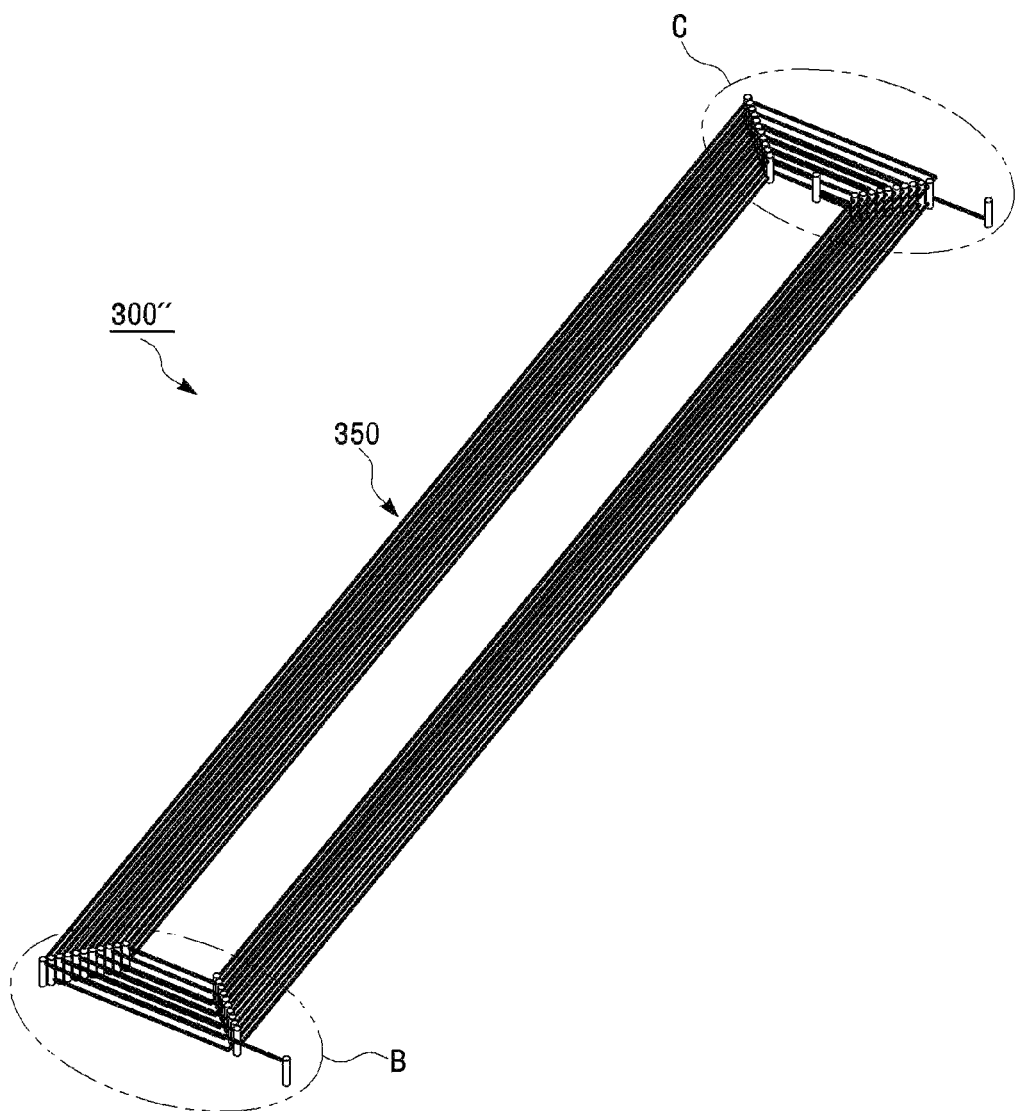

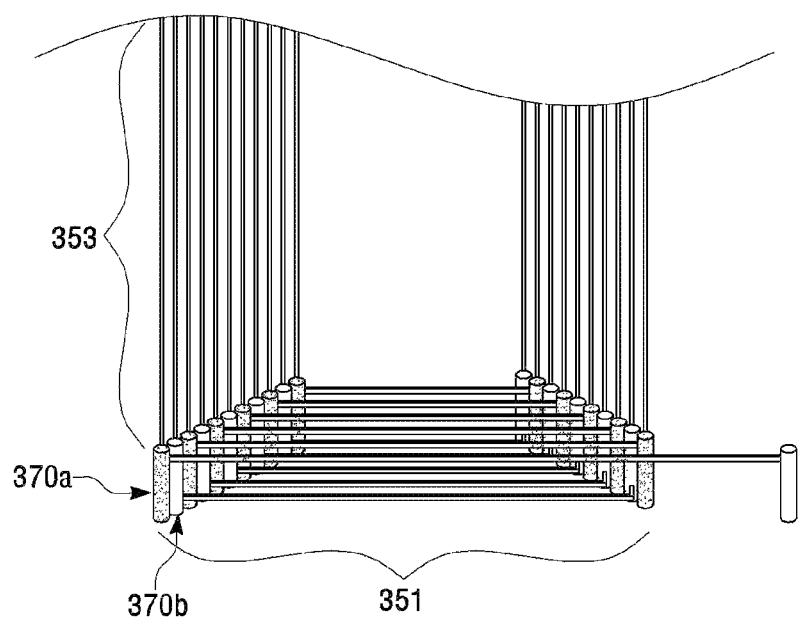
[Fig. 11]

[Fig. 12]
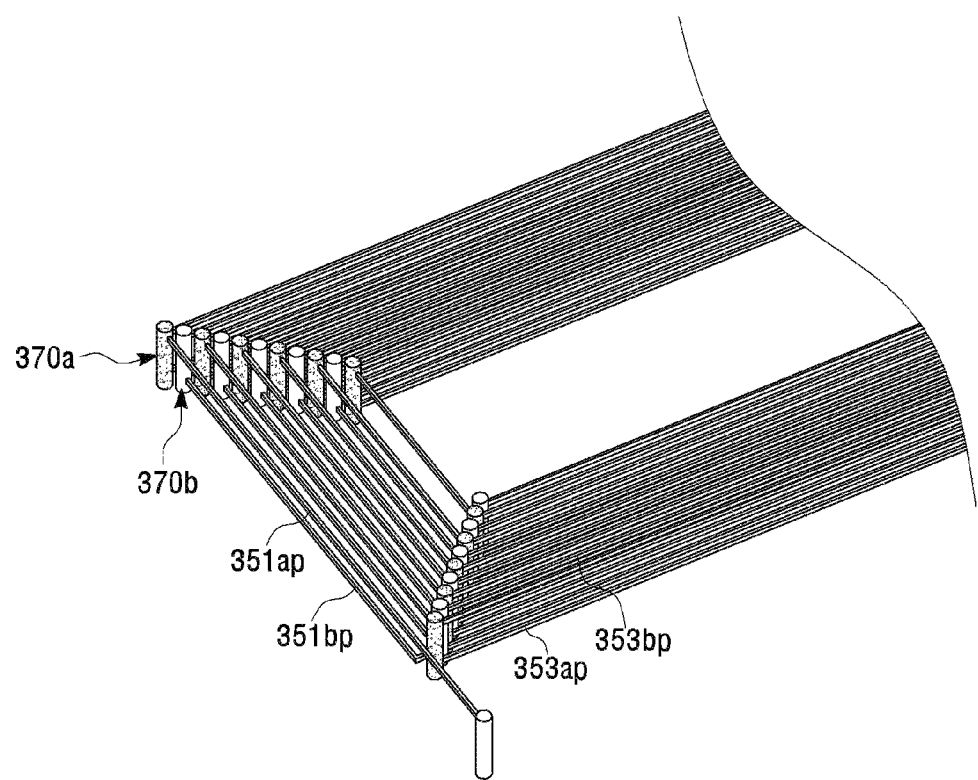

[Fig. 13]
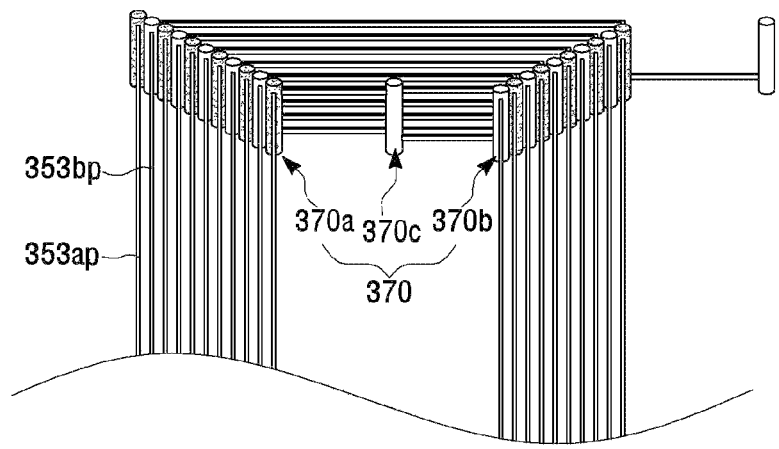

[Fig. 14a]
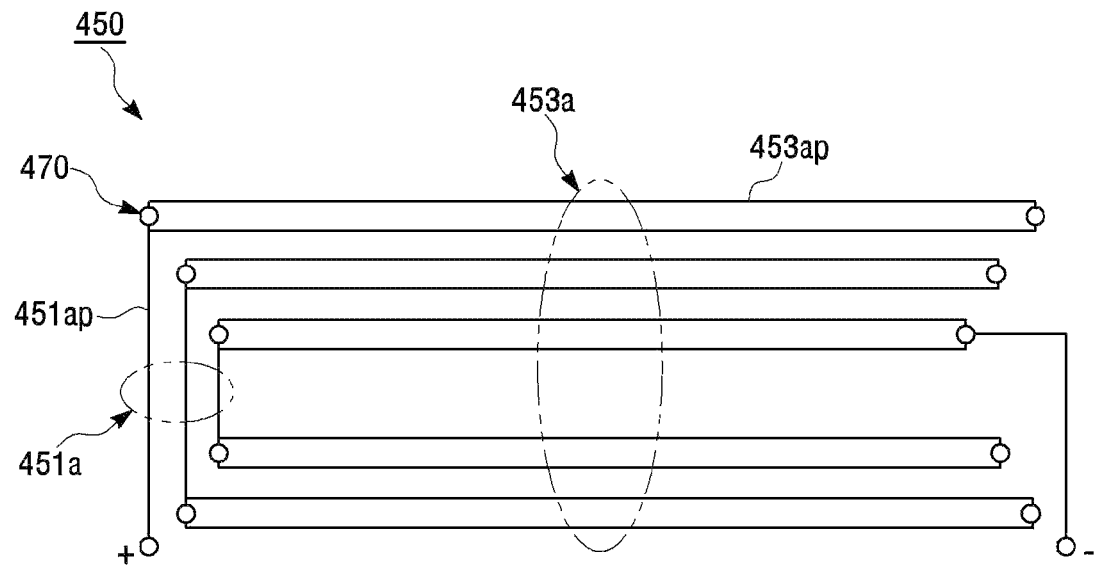
[Fig. 14b]
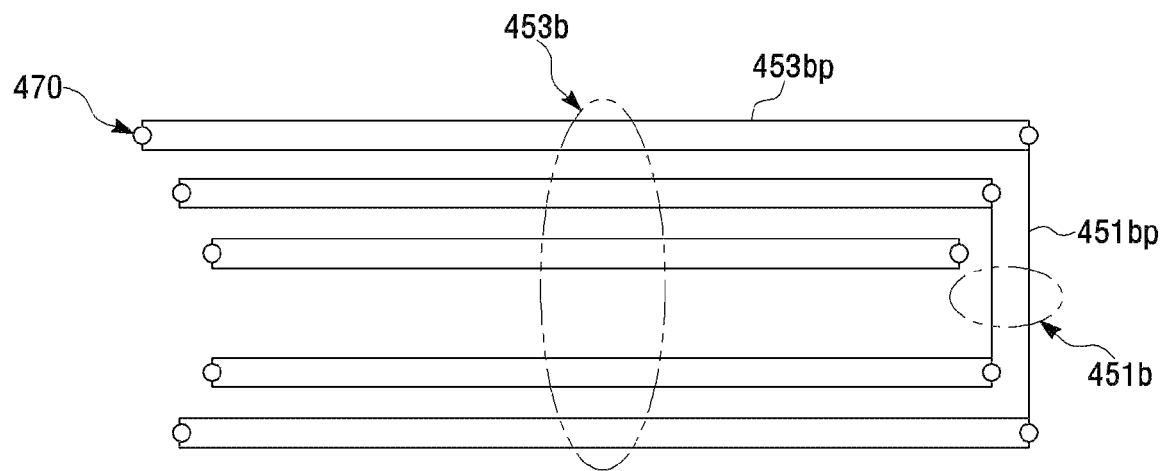

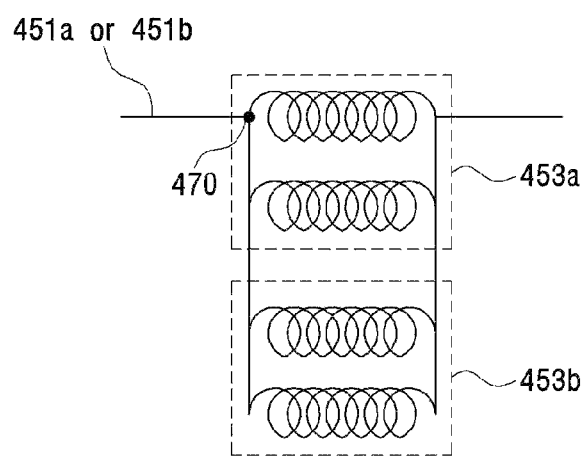
[Fig. 15]

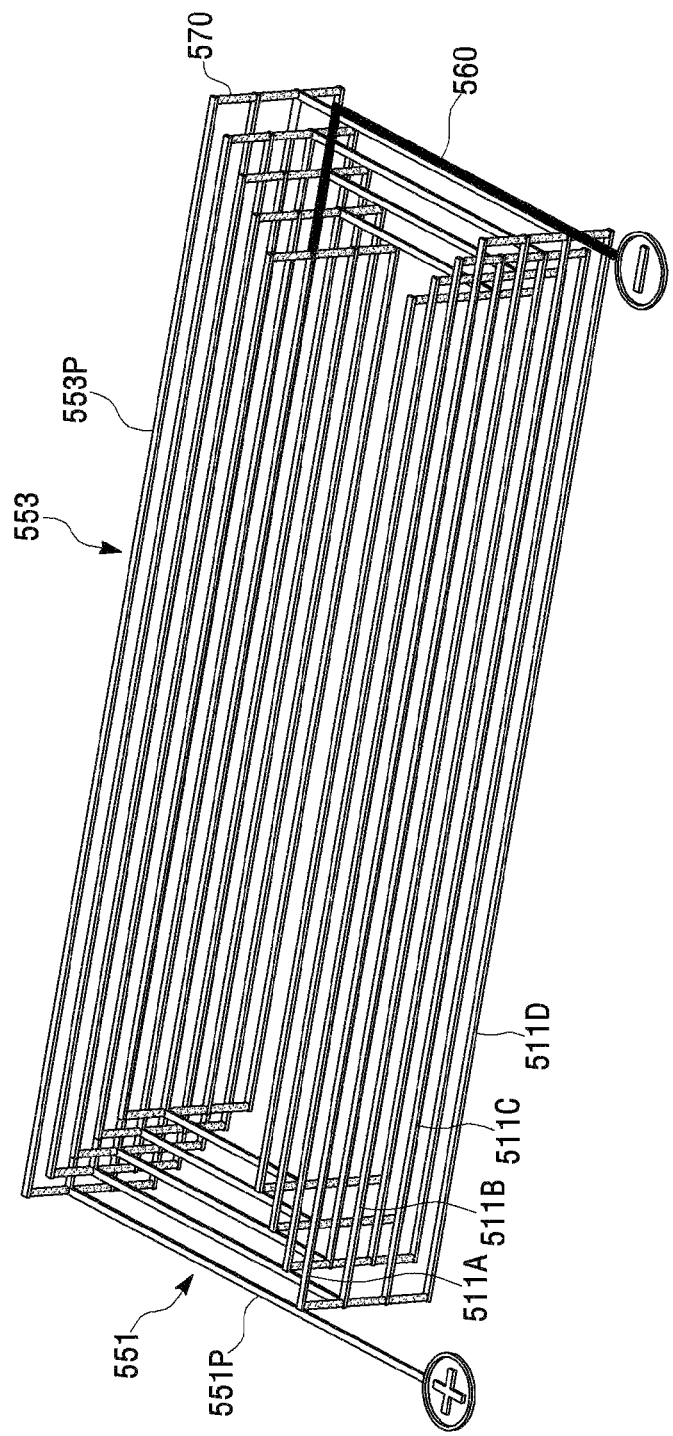
[Fig. 16]

[Fig. 17a]
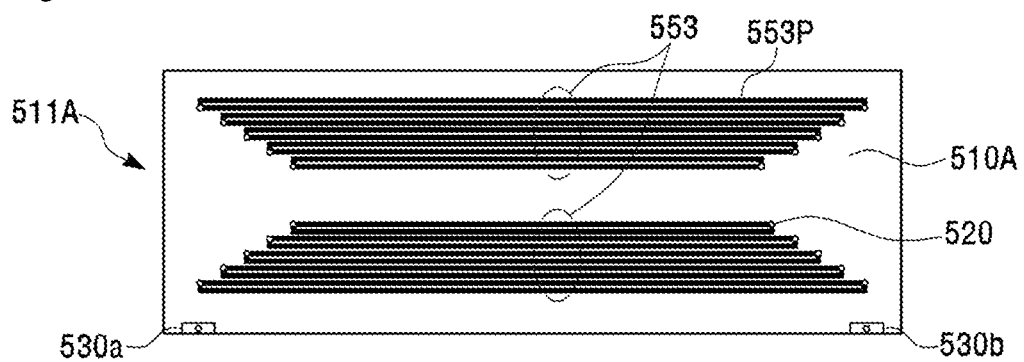
[Fig. 17b]
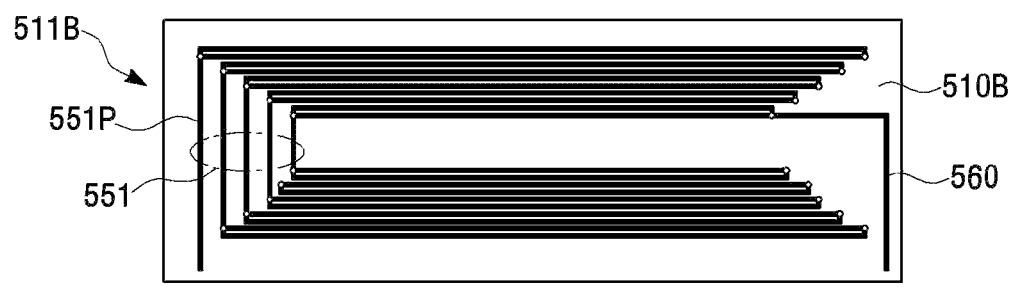
[Fig. 17c]
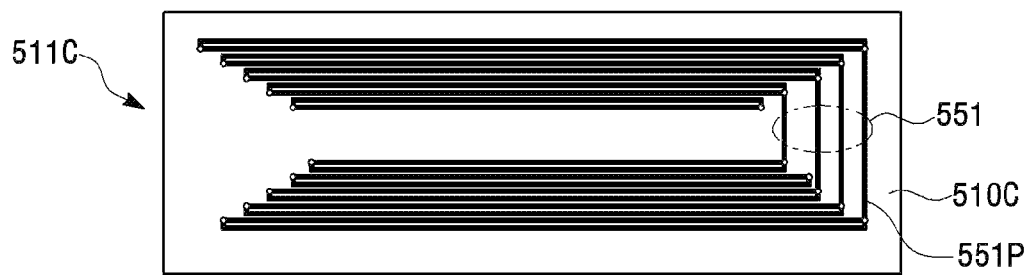
[Fig. 17d]

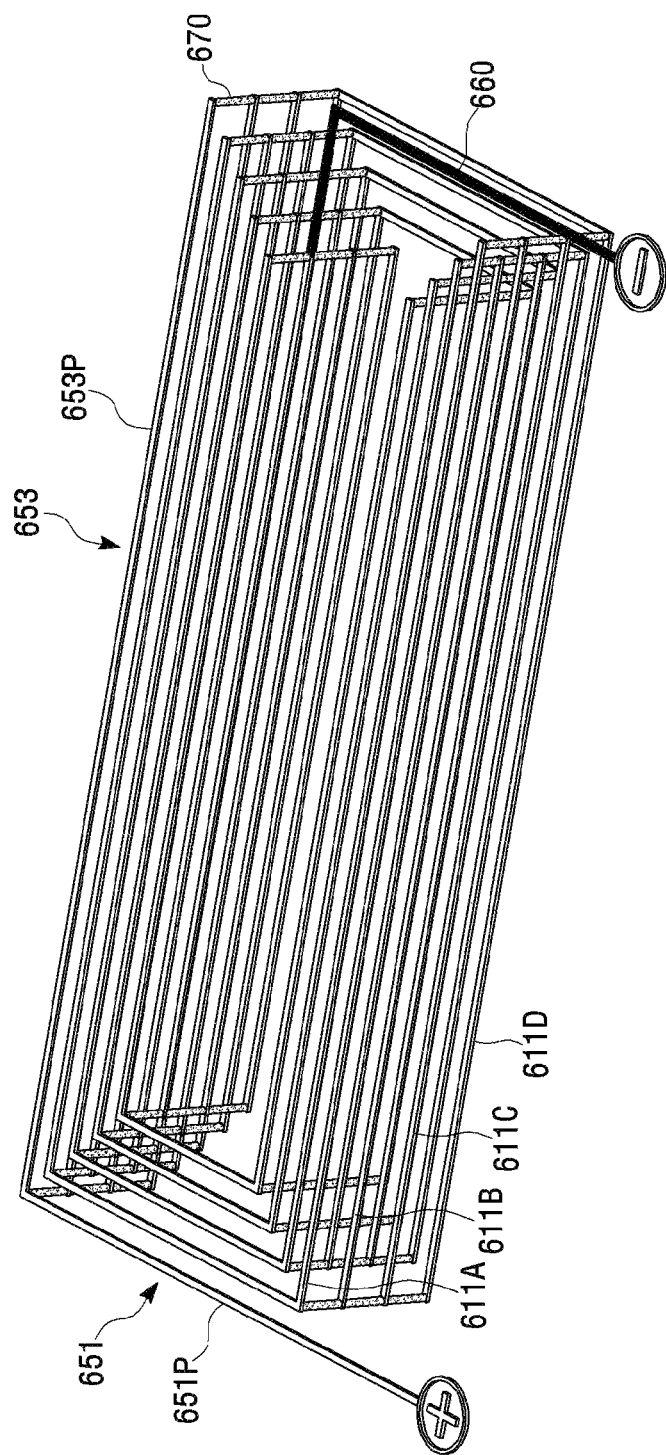
[Fig. 18]

[Fig. 19]
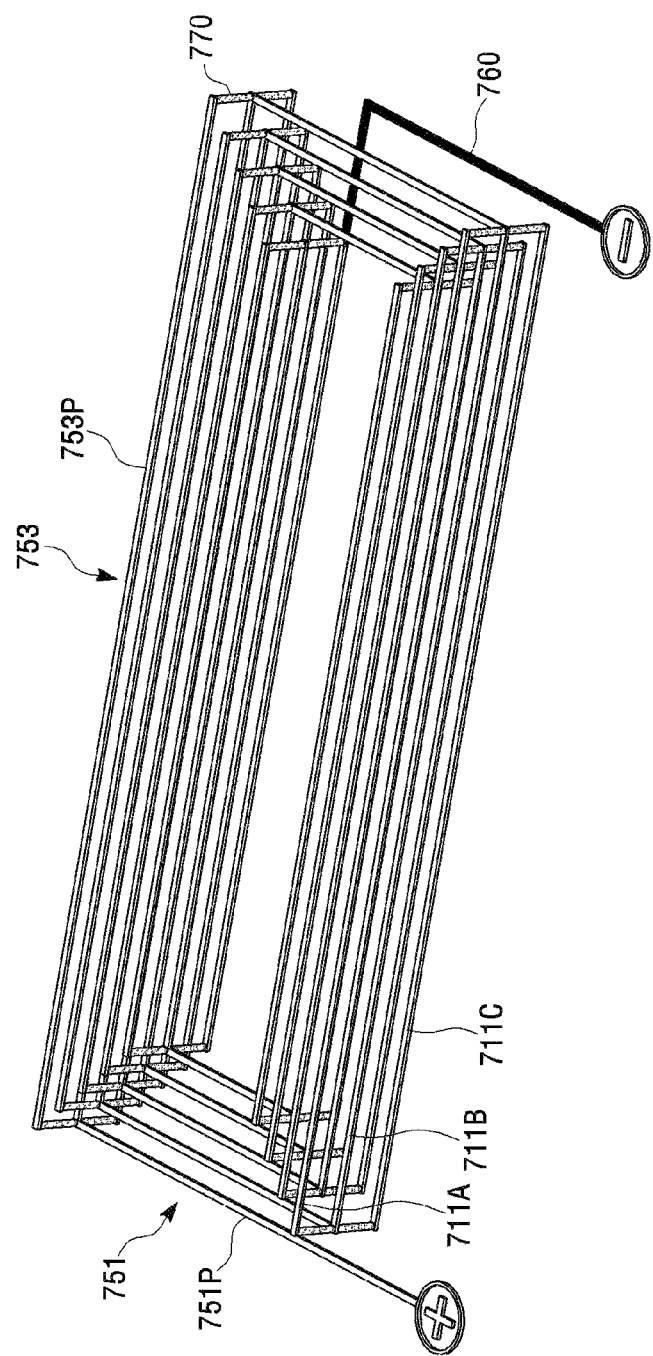

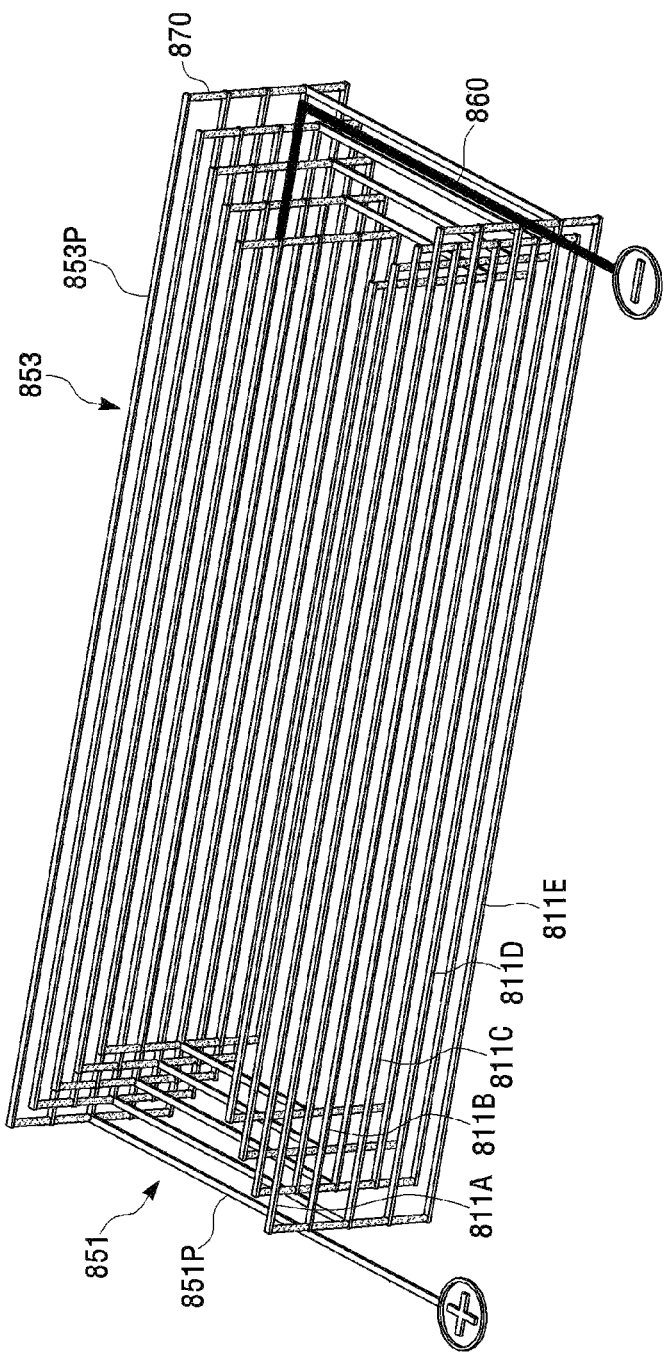
[Fig. 20]

VOICE COIL PLATE HAVING MULTI-PATTERNED COIL, AND FLAT PANEL SPEAKER COMPRISING VOICE COIL PLATE HAVING MULTI-LAYERED STRUCTURE

CROSS-REFERENCE TO RELATED PATENT APPLICATIONS

The present application is a U.S. national stage application under 35 U.S.C. § 371 of PCT Application No. PCT/KR2019/011134, filed Aug. 30, 2019, which claims priority to Korean Patent Application No. 10-2018-0102406, filed Aug. 30, 2018 and Korean Patent Application No. 10-2018-0109449, filed Sep. 13, 2018. The disclosures of the aforementioned priority applications are incorporated herein by reference in their entireties.

TECHNICAL FIELD

The present invention relates to a voice coil plate and a flat panel speaker, and more specifically, to: a voice coil plate having a multi-patterned coil for a slim speaker, the voice coil plate enabling weight reduction, impedance value reduction and inductance value enhancement; and a slim and flat speaker enabling weight reduction, impedance value reduction and inductance value enhancement.

BACKGROUND ART

Voice coil plates used in a speaker are formed by elliptically winding a voice coil or printing and patterning a voice coil on one surface or two surfaces of a predetermined base substrate.

In such a voice coil plate, when electric current flows through a voice coil, the flowing electric current generates, around a moving coil, a magnetic field that expands and contracts at the same frequency as an audio signal. Since the voice coil is subject to the magnetic field generated by a magnet inside a speaker unit, the voice coil plate moves upward and downward in response to the magnetic field while interacting with the magnetic field generated in the voice coil. Also, since the voice coil plate is connected to a vibration plate of the speaker unit, the vibration plate pushes air while moving upward and downward. Accordingly, sound is generated by the vibration of the air.

One example of speakers according to the related art is disclosed in Korean Patent Registration No. 10-1119495.

The speaker disclosed therein includes a base frame, a vibration plate, a magnet, a magnetic plate, and a voice coil plate.

Generally, the magnetic plate is disposed on a top, bottom, or side surface of the magnet to collect magnetic lines, the magnet and the magnetic plate are configured to be mounted on the base frame made of a plastic material, and a slot is formed in the center of the base frame so that the voice coil plate is inserted therein and can vibrate upward and downward.

As disclosed in the prior art document, in the voice coil formed in the voice coil plate according to the related art, an electromotive force is made to flow in the vertical direction different from that of a flow of a magnetic circuit flow of the speaker by some patterns (or vertical patterns) formed in the upward and downward vibration direction (or vertical direction) of the voice coil plate, and is induced in the left and right direction different from the upward and downward vibration direction of the speaker. Thus, it is required to remove or minimize the induced electromotive force generated as described above in order to improve efficiency of the speaker.

Also, a specific resistance value is increased as much as a line length of an unnecessary pattern in the voice coil, and thus impedance of the speaker is increased. The impedance of the speaker is inversely proportional to an inductance value, and thus there was a problem in than the efficiency of the speaker is deteriorated due to the increase in impedance of the speaker.

Also, the patterns unnecessary for the upward and downward vibration of the voice coil plate are formed on the base substrate, and thus weight of a vibration part of the entire speaker is increased. The increase in weight may have a negative effect because it opposes the sound pressure and efficiency of the speaker.

DISCLOSURE OF THE INVENTION

Technical Problem

An object to be achieved by the present invention is to provide a voice coil plate having a multi-patterned coil for a slim speaker, enabling significant reduction in weight.

Also, an object to be achieved by the present invention is to provide a voice coil plate having a multi-patterned coil for a slim speaker, enabling significant reduction in impedance value and enhancement in inductance value.

Also, an object to be achieved by the present invention is to provide a flat panel speaker including a multi-patterned voice coil and a voice coil plate having a multi-layered structure, enabling significant reduction in weight.

Also, provided is a structure of a voice coil which is formed in a voice coil plate having a multi-layered structure so as to significantly reduce an impedance value and enhance an inductance value.

Technical Solution

A voice coil plate having a multi-patterned coil according to an embodiment of the present invention comprises: a base substrate; and a voice coil formed on one surface of the base substrate, wherein the voice coil comprises a first pattern part arranged along a first direction and a second pattern part arranged along a second direction different from the first direction, wherein the first pattern part comprises a plurality of first patterns spaced apart at predetermined intervals, and the second pattern part comprises a plurality of second patterns spaced apart at predetermined intervals, wherein at least two of the second patterns, among the plurality of second patterns, are connected in parallel to one of the first patterns.

Here, the voice coil may be spirally printed on the one surface of the base substrate.

Here, the base substrate may have a single-layered structure, and the voice coil may be disposed on each of a top surface and a bottom surface of the base substrate.

Here, the base substrate may have a multi-layered structure, and the voice coil may be disposed on each of at least two surfaces among top surfaces and bottom surfaces of layers of the base substrate.

Here, the first direction may be an upward and downward vibration direction of the voice coil plate, and the second direction may be a direction perpendicular to the first direction.

A voice coil plate having a multi-patterned coil according to another embodiment of the present invention comprises:

a base substrate having at least two different flat surfaces; and a voice coil formed on the base substrate, wherein the base substrate comprises a connection part disposed passing through the at least two different flat surfaces, wherein the voice coil comprises a first pattern part arranged along a first direction and a second pattern part arranged along a second direction different from the first direction, wherein the first pattern part comprises a first pattern formed on one surface among the at least two different flat surfaces of the base substrate, and the second pattern part comprises a plurality of second patterns respectively disposed on the at least two different flat surfaces, wherein the first pattern is connected to the connection part, and the plurality of the second patterns are connected in parallel to the connection part.

Here, the base substrate may have a single-layered structure, and the at least two different flat surfaces may be a top surface and a bottom surface of the base substrate.

Here, the base substrate may have a multi-layered structure, and the at least two different flat surfaces may be top surfaces and bottom surface of layers of the base substrate.

Here, the voice coil may comprise a first voice coil and a second voice coil, wherein the connection part of the base substrate comprises: a first connection part disposed between the first pattern part and the second pattern part of the first voice coil; a second connection part disposed between the first pattern part and the second pattern part of the second voice coil; and a third connection part disposed between the first voice coil and the second voice coil.

Here, the first connection part and the second connection part may be alternately arranged along a third direction different from the first direction and the second direction.

Here, the first direction may be an upward and downward vibration direction of the voice coil plate, and the second direction may be a direction perpendicular to the first direction.

A voice coil plate having a multi-patterned coil according to another embodiment of the present invention comprises: a base substrate having at least two different flat surfaces; and a voice coil formed on the base substrate, wherein the base substrate comprises a connection part disposed passing through the at least two different flat surfaces, wherein the voice coil comprises a first pattern part arranged along a first direction and a second pattern part arranged along a second direction different from the first direction, wherein the first pattern part comprises a first pattern formed on one surface among the at least two different flat surfaces of the base substrate, and the second pattern part comprises a plurality of second patterns connected in parallel on each flat surface of the at least two different flat surfaces, wherein the first pattern is connected to the connection part, and the plurality of the second patterns disposed on the each flat surface are connected in parallel to the connection part.

A flat panel speaker comprising a multi-patterned voice coil and a voice coil plate having a multi-layered structure according to another embodiment of the present invention, comprises a voice coil plate on which a voice coil is formed, wherein the voice coil plate has a multi-layered structure, wherein the voice coil has a track shape in which a horizontal pattern part and a vertical pattern part are continuously wound from the outside to the inside, wherein the horizontal pattern part comprises one or more horizontal patterns, the horizontal pattern part is formed over all the layers of the voice coil plate, and the horizontal patterns on the respective layers are connected in parallel to each other through one or more via-holes, and the vertical pattern part is formed on one or more layers among all the layers of the voice coil plate and is connected to the horizontal pattern part through the one or more via-holes.

Here, the voice coil plate may have at least three layers, the voice coil may be formed on one surface or two surfaces of the voice coil plate, and the vertical pattern part may be formed on one or more layers among the inner layers of the voice coil plate.

Here, the voice coil may have a starting end and a terminating end, and a lead line connected to one terminal from the terminating end may be formed on one layer of the voice coil plate which does not intersect with the vertical pattern part.

Here, the horizontal pattern part and the vertical pattern part may comprise at least two voice coil lines, the horizontal pattern part may comprise a plurality of horizontal patterns in which at least two voice coil lines are connected in parallel, and the plurality of horizontal patterns and one voice coil line of the vertical pattern part may be connected in series to each other.

A flat panel speaker comprising a multi-patterned voice coil and a voice coil plate having a multi-layered structure according to another embodiment of the present invention, comprises a voice coil plate on which a voice coil is formed. One or more via-holes may be formed in the multi-layers, and voice coils on the layers are connected through the via-holes. The voice coils may be formed of a single line having a track shape starting from a (+) terminal and terminating at a (−) terminal from a top layer to a bottom layer.

Herein, the voice coil may be divided into a horizontal pattern part in a longitudinal direction and a vertical pattern part in a width direction, and at least two lines may be connected in parallel in the horizontal pattern part.

Herein, the voice coil may be divided into a horizontal pattern part in a longitudinal direction and a vertical pattern part in a width direction, and the horizontal pattern part may comprise one or more horizontal patterns. The horizontal pattern part may be formed over all the layers of the voice coil plate, and the horizontal patterns on the respective layers are connected in parallel to each other through one or more via-holes. The vertical pattern part may be formed on one or more layers among all the layers of the voice coil plate and may be connected to the horizontal pattern part through the one or more via-holes.

Here, the horizontal pattern part and the vertical pattern part may comprise at least two voice coil lines, the horizontal pattern part may comprise a plurality of horizontal patterns in which at least two voice coil lines are connected in parallel, and the plurality of horizontal patterns and one voice coil line of the vertical pattern part may be connected in series to each other.

Advantageous Effects

According to the configurations of the present invention described above, the embodiments of disclosed techniques may have effects including the following advantages. However, it is not intended to mean that the embodiments of disclosed techniques encompass all of the advantages, and thus it should be understood that the scope of right of disclosed techniques is not limited thereto.

When the voice coil plate having a multi-patterned coil for a slim speaker according to the embodiments of the present invention is used, a value of inductance (L) is maintained with respect to a horizontal pattern (or a horizontal coil) having a direct role in a magnetic circuit, and a vertical pattern (or a vertical coil) connected thereto is connected again in parallel to one surface or multiple layers. Thus, advantages are obtained in that the weight of a vibration part of the speaker may be significantly reduced, and the inductance value may be enhanced.

Furthermore, as the weight of the voice coil plate is reduced, advantages are obtained in that the upward and downward vibration efficiency of the voice coil plate may be increased, the impedance value may be significantly reduced, and the value of inductance (L) may be enhanced while maintaining the impedance value.

Also, when the flat panel speaker including a multi-patterned voice coil and a voice coil plate having a multi-layered structure according to an embodiment of the present invention is used, advantages are obtained in that the weight may be significantly reduced.

Also, when the flat panel speaker including a multi-patterned voice coil and a voice coil plate having a multi-layered structure according to an embodiment of the present invention is used, advantages are obtained in that the impedance value may be significantly reduced while the impedance value is enhanced.

BRIEF DESCRIPTION OF THE DRAWINGS

FIG. 1 is a perspective view of a voice coil plate according to an embodiment of the present invention.

FIG. 2 is an enlarged plan view of a region 'A' of FIG. 1.

FIG. 3 is a modified example of a voice coil plate illustrated in FIG. 2.

FIG. 4 is another modified example of a voice coil plate illustrated in FIG. 2.

FIG. 5a is an equivalent circuit of a voice coil illustrated in FIG. 2.

FIG. 5b is an equivalent circuit of a voice coil illustrated in FIG. 4.

FIG. 6 is a perspective view of a voice coil plate 200 according to another embodiment of the present invention.

FIG. 7a is an equivalent circuit of first and second voice coils illustrated in FIG. 6.

FIG. 7b is an equivalent circuit of a modified example in (a) of FIG. 7.

FIG. 8 is a perspective view of a voice coil plate 300 according to another embodiment of the present invention.

FIG. 9 is a perspective view of a voice coil plate 300' according to another embodiment of the present invention.

FIG. 10 is a perspective view of a voice coil plate 300" according to another embodiment of the present invention.

FIG. 11 is an enlarged perspective view when a region 'B' illustrated in FIG. 10 is viewed from one side.

FIG. 12 is an enlarged perspective view when a region 'B' illustrated in FIG. 10 is viewed from another side.

FIG. 13 is an enlarged perspective view when a region 'C' illustrated in FIG. 10 is viewed from one side.

FIGS. 14a-b are schematic views of some portions of a voice coil. FIG. 14a is a portion of a voice coil 450 disposed on one surface of a base substrate in a voice coil plate having a multi-patterned coil for a slim speaker according to another embodiment of the present invention, and FIG. 14b is a schematic view of the other portions of the voice coil 450 disposed on another surface of the base substrate.

FIG. 15 is an equivalent circuit for a portion of the voice coil 450 illustrated in FIGS. 14a-b.

FIG. 16 is a perspective view of a voice coil plate according to another embodiment of the present invention.

FIGS. 17a-d are implementation diagrams of a voice coil for each of layers of a voice coil plate illustrated in FIG. 16.

FIG. 18 is a modified example of FIG. 16.

FIG. 19 is another modified example of FIG. 16.

FIG. 20 is another modified example of FIG. 16.

MODE FOR CARRYING OUT THE INVENTION

Hereinafter, structures and beneficial effects of a multi-patterned voice coil, a voice coil plate, and a flat panel speaker according to the present invention will be described with reference to the accompanying drawings.

The detailed description of the specific embodiments illustrated in the accompanying drawings is read in conjunction with the accompanying drawings, and the drawings are considered part of the entire written description. Any reference to direction or orientation is merely intended for convenience of description and is not intended in any way to limit the scope of the present invention.

Specifically, relative terms such as "lower, upper, horizontal, vertical, above, below, up, down, top, and bottom" and derivatives thereof (e.g., "horizontally, downwardly, upwardly," etc.) should be construed to refer to the orientation as then described or as shown in the drawing under discussion. These relative terms are for convenience of description only and do not require that the apparatus be constructed or operated in a particular orientation.

Also, terms indicating coupling relationship between components such as "attached, affixed, connected, coupled, interconnected" may mean that individual components are attached, connected, or fixed to each other directly or indirectly unless otherwise specified, and this should be understood as encompassing being attached, connected, fixed in unmovable state as well as in a movable state.

When reference numerals are given to elements in each drawing, it should be noted that the same elements will be designated by the same reference numerals if possible although they are shown in different drawings. Further, in the description of embodiments of the present invention, a detailed description of known configurations or functions incorporated herein will be omitted when it may make the subject matter of the present invention rather unclear.

A voice coil plate having a multi-patterned coil for a slim speaker or for a flat panel speaker according to embodiments of the present invention includes a base substrate and a voice coil.

The base substrate may include a top surface and a bottom surface and may be formed in a single layer or in a multi-layer. In the following drawings, the base substrate may be omitted.

The base substrate may be a plate having a predetermined thickness and two surfaces. The base substrate may have a quadrangular shape, but the shape thereof is not limited thereto. For example, the base substrate may have a polygonal shape, or a circular or elliptical shape.

The voice coil is formed on the base substrate. Particularly, the voice coil may be formed by being printed on one surface or two surfaces of the base substrate. Here, when the base substrate is configured to have multiple layers, the voice coil may be formed by being printed on one surface or two surfaces of each of the multiple layers of the base substrate. The voice coil may be formed by a PCB process for etching the base substrate, and a process for forming (plating) a pattern after establishing solder is also possible. Here, the method for forming the voice coil is not limited to the PCB process or plating process described above, and the method for forming the voice coil may be performed through a well-known or common process in the art. For example, a process through MEMS technology is possible, an etching process using laser is possible, and a printing process is also possible. As described above, there are various methods for forming the voice coil, and the method for forming the voice coil is not limited to a specific process.

The voice coil has a multi-pattern or a multi-coil. The multi-pattern or the multi-coil may be utilized in a horizontal pattern having a direct role in a magnetic circuit. The multi-pattern or the multi-coil utilized in the horizontal pattern may be formed in parallel on one surface of the base substrate (parallel on one surface) or may be formed in parallel on each of at least two different flat surfaces of the base substrate (parallel on two surfaces or parallel on multiple layers). The multi-pattern or the multi-coil utilized in the horizontal pattern may be formed in parallel on the at least two different flat surfaces of the base substrate through a plurality of connection parts or conductive via-holes formed in the base substrate. The multi-pattern or the multi-coil utilized in the horizontal pattern may be formed in parallel on one surface of the base substrate or may be formed in parallel on at least two different flat surfaces of the base substrate. Specific examples will be described below in detail with reference to the drawings.

In the voice coil plate including the base substrate and the voice coil, when alternate current is provided to the voice coil, the direction of a force is reversed whenever the direction of current flowing through the voice coil is reversed according to Fleming's left-hand law. Thus, the voice coil plate moves upward and downward, and as a result, a vibration plate linked with the voice coil plate reciprocates, and sound is played from a speaker. Here, a high tone may be played when the vibration plate vibrates rapidly (high frequency), and a low tone may be played when the vibration plate vibrates slowly (low frequency). A strong sound may be played when an amplitude of the vibration plate is large, and a weak sound may be played when the amplitude of the vibration plate is small.

Hereinafter, the shape and structure of a voice coil of a voice coil plate according to various embodiments of the present invention will be described in detail with reference to the drawings.

FIG. 1 is a perspective view of a voice coil plate having a multi-patterned coil for a slim speaker according to one embodiment of the present invention, and FIG. 2 is an enlarged plan view of a region 'A' of FIG. 1.

A voice coil plate 100 illustrated in FIG. 1 and FIG. 2 may include a base substrate 110 and a voice coil 150 formed in the base substrate 110. The voice coil plate 100 and the base substrate 110 are described herein as being separated, but the base substrate 110 itself may actually serve as the voice coil plate 100.

The voice coil 150 may be formed by being printed on one surface of the base substrate 110.

The voice coil 150 may include one end 152 and the other end 154 formed on one surface of the base substrate 110.

Pattern parts 151 and 153 are formed between the one end 152 and the other end 154 of the voice coil 150.

The pattern parts 151 and 153 may be formed helically or spirally on one surface of the base substrate 110.

The pattern parts 151 and 153 may include a first pattern part 151 and a second pattern part 153.

The first pattern part 151 is formed on one surface of the base substrate 110 along a first direction. The first pattern part 151 has a plurality of first patterns 151p. The plurality of first patterns 151p are spaced apart at predetermined intervals from each other and disposed on one surface of the base substrate 110. The plurality of first patterns 151p are disposed in parallel.

The first direction may be an upward and downward vibration direction of the voice coil plate 100. That is, the plurality of first patterns 151p of the first pattern part 151 may be arranged in the upward and downward vibration direction of the voice coil plate 100. Here, the first pattern part 151 may be referred to as a vertical pattern part or a vertical coil part, and the plurality of first patterns 151p of the first pattern part 151 may be referred to as a plurality of first vertical patterns or a plurality of first vertical coils.

The second pattern part 153 is formed on one surface of the base substrate 110 along a second direction. The second pattern part 153 has a plurality of second patterns 153p. The plurality of second patterns 153p are spaced apart at predetermined intervals from each other and disposed on one surface of the base substrate 110. The plurality of second patterns 153p are disposed in parallel.

At least two of the second patterns 153p, among the plurality of second patterns 153p of the second pattern part 153, are connected in parallel to one of the first patterns 151p of the first pattern part 151. The at least two of the second patterns 153b are connected in parallel to one of the first patterns 151p of the first pattern part 151, and thus the number of the plurality of first patterns 151p of the first pattern part 151 is less than the number of the plurality of second patterns 153p of the second pattern part 153.

Since the at least two of the second patterns 153b are connected in parallel to one of the first patterns 151p of the first pattern part 151, an impedance value of the voice coil 150 may be reduced, and an inductance value of the voice coil 150 may be increased. Also, since the number of the first patterns 151p is less than the number of the second patterns 153p, the weight of the voice coil plate 100 may be reduced, and enhancement in sound pressure of the speaker may be promoted due to the reduction in weight of the voice coil plate 100.

The second direction may be a direction perpendicular to the upward and downward vibration direction of the voice coil plate 100. That is, the plurality of second patterns 153p of the second pattern part 153 may be arranged in the direction perpendicular to the upward and downward vibration direction of the voice coil plate 100. Here, the second pattern part 153 may be referred to as a horizontal pattern part or a horizontal coil part. The plurality of second patterns 153p of the second pattern part 153 may be referred to as a plurality of second horizontal patterns or a plurality of second horizontal coils.

FIG. 3 is a modified example of the voice coil plate illustrated in FIG. 2, and FIG. 4 is another modified example of the voice coil plate illustrated in FIG. 2.

As illustrated in FIG. 3, a second pattern part 153' includes a plurality of second patterns 153p, and three of the second patterns 153p may be connected in parallel to one of the first patterns 151.

Also, as illustrated in FIG. 4, a second pattern part 153" includes a plurality of second patterns 153p, and four of the second patterns 153p may be connected in parallel to one of the first patterns 151.

As illustrated in FIGS. 2 to 4, the number of the second patterns 153p connected in parallel to one of the first patterns 151p may be at least two. The impedance value or the inductance value of the voice coil 150 may be adjusted by controlling the number of the second patterns 153p connected in parallel to one of the first patterns 151p.

Here, FIG. 5a is an equivalent circuit of the voice coil illustrated in FIG. 2, and FIG. 5b is an equivalent circuit of the voice coil illustrated in FIG. 4.

Referring to FIG. 2 and FIG. 5a, two of the second patterns 153p of the second pattern part 153 are connected in parallel to one of the first pattern 151p.

Referring to FIG. 4 and (b) of FIG. 5, four of the second patterns 153p of the second pattern part 153" are connected in parallel to one of the first pattern 151p.

As described above, referring to FIGS. 1 to 5, in the voice coil plate 100 according to one embodiment of the present invention, a value of inductance (L) is maintained with respect to the second pattern part 153 having a direct role in a magnetic circuit. As at least two of the second patterns 153p are connected in parallel to one of the first patterns 151p of the first pattern part 151, the weight of a vibration part, which is one of the most important elements in the speaker, may be significantly reduced, and the inductance value may be increased. That is, as the number of the first pattern 151p of the first pattern part 151 is minified, the weight of the voice coil plate 100 is reduced, efficiency of induced electromotive force for the upward and downward vibration of the speaker is increased. The parallel connection may significantly reduce the impedance value or increase a value of inductance (L) while maintaining the impedance.

FIG. 6 is a perspective view of a voice coil plate 200 having a multi-patterned coil for a slim speaker according to another embodiment of the present invention.

Referring to FIG. 6, in the voice coil plate 200 according to another embodiment of the present invention, first and second voice coils 250a and 250b are respectively formed on two surfaces of a base substrate 210.

A first voice coil 250a formed on a top surface of the base substrate 210 is the same as the voice coil 150 illustrated in FIGS. 1 and 2, and a second voice coil 250b formed on a bottom surface of the base substrate 210 is also the same as the voice coil 150 illustrated in FIGS. 1 and 2. Here, the first voice coil 250a may be the voice coil illustrated in FIG. 3 or 4, and the second voice coil 250b may also be the voice coil illustrated in FIG. 3 or 4.

The other end of the first voice coil 250a and one end of the second voice coil 250 are electrically connected by a connection part 250c formed in the base substrate 210. The connection part 250c may be a conductive member formed in a via-hole that passes through the top surface and the bottom surface of the base substrate 210.

Here, FIG. 7a is an equivalent circuit of the first and second voice coils illustrated in FIG. 6, and FIG. 7b is an equivalent circuit of an modified example of FIG. 7a.

Referring to FIG. 7a, a second pattern part 253a of the first voice coil 250a and a second pattern part 253b of the second voice coil 250b are connected in parallel.

In FIG. 7b, four of second patterns, among the second patterns included in each of a second pattern part 253a" of a first voice coil and a second pattern part 253b" of a second voice coil, are connected in parallel to one of first patterns. Referring to FIG. 7b, the second pattern part 253a" of the first voice coil and the second pattern part 253b" of the second voice coil are connected in parallel.

FIG. 8 is a perspective view of a voice coil plate 300 having a multi-patterned coil for a slim speaker according to another embodiment of the present invention.

The voice coil plate 300 according to another embodiment of the present invention includes a base substrate (not shown) and voice coils 351 and 353 formed on the base substrate (not shown).

The base substrate (not shown) may have a single-layered structure as illustrated in FIG. 1, but is not limited thereto. The base substrate (not shown) may have a multi-layered structure. When the base substrate (not shown) has a multi-layered structure, each of layers may have a top surface and a bottom surface.

The base substrate (not shown) includes a plurality of connection parts 370. Each of the plurality of connection parts 370 may be a conductive member formed by filling a conductive material into a via-hole passing through the base substrate (not shown). The first pattern part 351 and the second pattern part 353 may be electrically connected through the connection part 370.

The voice coils 351 and 353 includes the first pattern part 351 and the second pattern part 353. The connection part 370 is disposed between the first pattern part 351 and the second pattern part 353. The first pattern part 351 and the second pattern part 353 are electrically connected through the connection part 370.

The first pattern part 351 is formed on the base substrate along a first direction. The first pattern part 351 has a plurality of first patterns 351p. The plurality of first patterns 351p are spaced apart at predetermined intervals from each other and disposed on the base substrate. The plurality of first patterns 351p may be disposed in parallel.

The plurality of first patterns 351p may be disposed on one surface of the base substrate. However, the embodiment is not limited thereto, and the plurality of first patterns 351p may be disposed on different flat surfaces rather than the same flat surface.

For example, when the base substrate has a single-layered structure, some of the plurality of first patterns 351p may be disposed on the top surface of the base substrate, and the others may be disposed on the bottom surface of the base substrate.

Also, when the base substrate has a multi-layered structure, some of the plurality of first patterns 351p may be disposed on one surface among the top surface and the bottom surface of each layer, and others may be disposed on another surface. For example, some of the first patterns among the plurality of first patterns 351p may be disposed on a top surface or a bottom surface of a first layer of the base substrate having the multi-layered structure, and the others of the first patterns may be disposed on a top surface or a bottom surface of an n-th layer of the base substrate having the multi-layered structure (where, n is a natural number greater than one).

The first direction may be an upward and downward vibration direction of the voice coil plate 300. That is, the plurality of first patterns 351p of the first pattern part 351 may be arranged in the upward and downward vibration direction of the voice coil plate 300. Here, the first pattern part 351 may be referred to as a vertical pattern part or a vertical coil part, and the plurality of first patterns 351p of the first pattern part 351 may be referred to as a plurality of first vertical patterns or a plurality of first vertical coils.

The second pattern part 353 is formed on the base substrate (not shown) along a second direction. The second pattern part 353 has a plurality of second patterns 353p. The plurality of second patterns 353p are spaced apart at predetermined intervals from each other and disposed on the base substrate (not shown). The plurality of second patterns 353p may be disposed in parallel.

The plurality of second patterns 353p are not disposed on only one surface of the base substrate, unlike the plurality of the second patterns 153p illustrated in FIG. 1. The plurality of second patterns 353p may be disposed on different flat surfaces of the base substrate.

For example, when the base substrate has the single-layered structure, the plurality of second patterns 353p may be disposed on the top surface and the bottom surface of the base substrate.

Also, when the base substrate has the multi-layered structure, the plurality of second patterns 353p may be disposed on at least two different flat surfaces among the top surfaces and bottom surfaces of layers. Here, the different flat surfaces represent the top surface and the bottom surface of the base substrate when the base substrate has the single-layered structure, and the different flat surfaces represent top surfaces and bottom surfaces of layers when the base substrate has the multi-layered structure.

The second patterns 353p disposed on the at least two different flat surfaces are connected to the one of the connection parts 370, and one of the first patterns 351p of the first pattern part 351 is connected to one of the connection parts 370. Thus, at least two second patterns 353p are connected in parallel through the one of the connection parts 370. Here, two of the second patterns 353p are connected in parallel to one of the connection parts 370 in FIG. 8, but at least three of the second patterns 353p may be connected in parallel to one of the connection parts 370.

The second direction may be a direction perpendicular to the upward and downward vibration direction of the voice coil plate 300. That is, the plurality of second patterns 353p of the second pattern part 353 may be arranged in the direction perpendicular to the upward and downward vibration direction of the voice coil plate 300. Here, the second pattern part 353 may be referred to as a horizontal pattern part or a horizontal coil part. The plurality of second patterns 353p of the second pattern part 353 may be referred to as a plurality of second horizontal patterns or a plurality of second horizontal coils.

The voice coil plate 300 having a multi-patterned coil for a slim speaker according to another embodiment of the present invention illustrated in FIG. 8 has the following structural features compared to the voice coil plate 100 according to one embodiment of the present invention illustrated in FIG. 1.

In the voice coil plate 100 illustrated in FIG. 1, the plurality of second patterns 153p of the second pattern part 153 are disposed on one surface of the base substrate 110, that is, on the same flat surface. However, in the voice coil plate 300 illustrated in FIG. 8, the plurality of second patterns 353p of the second pattern part 353 are disposed on at least two different flat surfaces of the base substrate (not shown).

The voice coil plate 300 illustrated in FIG. 8 may have the same effect as the voice coil plate 100 illustrated in FIG. 1. Furthermore, the voice coil plate 300 illustrated in FIG. 8 has an advantage in that distances between the plurality of second patterns 353p may be made shorter than distances between the plurality of second patterns 153p of the voice coil plate 100 illustrated in FIG. 1. Thus, the advantage is obtained in that the voice coil plate 300 may be further reduced in size.

FIG. 9 is a perspective view of a voice coil plate 300' having a multi-patterned coil for a slim speaker according to another embodiment of the present invention.

The voice coil plate 300' illustrated in FIG. 9 further includes components in addition to those of the voice coil plate 300 illustrated in FIG. 8.

Referring to FIG. 9, the voice coil plate 300' includes a base substrate (not shown) having a plurality of connection parts 370a, 370b, and 370c and first voice coils 351ap and 353ap and second voice coils 351bp and 353bp formed on the base substrate (not shown).

Here, the first voice coils 351ap and 353ap and the plurality of first connection parts 370a illustrated in FIG. are the same as the voice coils 351 and 353 and the plurality of connection parts 370 illustrated in FIG. 8.

The voice coil plate 300' further includes the second voice coils 351bp and 353bp and the plurality of second connection parts 370b.

The second voice coils 351bp and 353bp include a first pattern part and a second pattern part as in the first voice coils 351ap and 353ap. The first pattern part includes a plurality of first patterns 351bp, and the second pattern part includes a plurality of second patterns 353bp. The plurality of first patterns 351bp are disposed on the base substrate along a first direction, and the plurality of second patterns 353bp are disposed on the base substrate along a second direction.

The plurality of second connection parts 370b may be disposed between the plurality of first connection parts 370a. At least two of the second patterns 353bp disposed on different flat surfaces from the first patterns 351bp are electrically connected by each of the second connection parts 370b. At least two of the second patterns 353bp are connected in parallel by the second connection part 370b.

The base substrate (not shown) further includes a third connection part 370c. The third connection part 370c electrically connect the first pattern 351ap of the first voice coil and the first pattern 351bp of the second voice coil.

The voice coil plate 300' according to another embodiment of the present invention illustrated in FIG. 9 further includes one or more voice coils compared to the voice coil plate 300 illustrated in FIG. 8. Thus, a higher inductance value may be obtained, and thus the efficiency is improved.

FIG. 10 is a perspective view of a voice coil plate 300" having a multi-patterned coil for a slim speaker according to another embodiment of the present invention, FIG. is an enlarged perspective view when a region 'B' illustrated in FIG. 10 is viewed from one side, FIG. 12 is an enlarged perspective view when the region 'B' illustrated in FIG. 10 is viewed from another side, and FIG. 13 is an enlarged perspective view when a region 'C' illustrated in FIG. 10 is viewed from one side.

The voice coil plate 300" according to another embodiment of the present invention illustrated in FIGS. 10 to 13 is obtained by further specifying the voice coil plate 300' illustrated in FIG. 9.

Referring to FIGS. 10 to 13, the voice coil plate 300" according to another embodiment of the present invention includes a base substrate (not shown), a voice coil 350, and a plurality of connection parts 370a, 370b, and 370c.

The base substrate (not shown) may have a single-layered structure as illustrated in FIG. 1, but is not limited thereto. The base substrate (not shown) may have a multi-layered structure. When the base substrate (not shown) has a multi-layered structure, each of layers may have a top surface and a bottom surface.

The voice coil 350 includes the first voice coil and the second voice coil illustrated in FIG. 9.

The plurality of connection parts 370a, 370b, and 370c include a plurality of first connection parts 370a, a plurality of second connection parts 370b, and a plurality of third connection parts 370c illustrated in FIG. 9.

The plurality of first connection parts 370a and the plurality of second connection parts 370b may be arranged alternately along a third direction. Here, the third direction is a direction different from the first direction and the second direction. For example, the third direction may be direction from each corner of the base substrate toward the center of the base substrate or a direction between the first direction and the second direction.

FIG. 14a is a schematic view of some portions of a voice coil 450 disposed on one surface of a base substrate in a voice coil plate having a multi-patterned coil for a slim speaker according to another embodiment of the present invention, and FIG. 14b is a schematic view of the other portions of the voice coil 450 disposed on another surface of the base substrate.

The voice coil plate having a multi-patterned coil for a slim speaker according to another embodiment of the present invention illustrated in FIGS. 14a-b includes a base substrate (not shown), a voice coil 450, and a plurality of connection parts 470.

The base substrate (not shown) includes a first surface on which a first voice coil 450a is disposed and a second surface on which a second voice coil 450b is disposed.

The base substrate (not shown) may have a single- or multi-layered structure. When the base substrate (not shown) has the single-layered structure, the first surface may be a top surface, and the second surface may be a bottom surface. Here, when the base substrate (not shown) has the multi-layered structure, the first surface and the second surface may be positioned on different flat surfaces. For example, the first surface may be a top surface of a first layer, and the second surface may be a top surface or a bottom surface of a second layer positioned below the first layer.

The base substrate (not shown) may have the plurality of connection parts 470 that pass through the base substrate (not shown). Each of the plurality of connection parts 470 may be a conductive member formed by filling a conductive material into a via-hole formed in the base substrate (not shown).

Through the plurality of connection parts 470, the voice coil 450 may be disposed on at least two different surfaces of the base substrate (not shown).

The voice coil 450 may be formed by combining the voice coil 150 illustrated in FIGS. 1 and 2 and the voice coil 351, 353 illustrated in FIG. 8.

The voice coil 450 includes first pattern parts 451a and 451b and second pattern parts 453a and 453b. The connection part 470 is disposed between the first pattern parts 451a and 451b and the second pattern parts 453a and 453b. The first pattern parts 451a and 451b and the second pattern parts 453a and 453b are electrically connected through the connection part 470.

The first pattern parts 451a and 451b are formed on the base substrate along a first direction. The first pattern parts 451a and 451b have a plurality of first patterns 451ap and 451bp. The plurality of first patterns 451ap and 451 bp are spaced apart at predetermined intervals from each other and disposed on the base substrate. The plurality of first patterns 451ap and 451 bp may be disposed in parallel.

The plurality of first patterns 451ap and 451 bp may be disposed on at least two different flat surfaces of the base substrate. For example, the first patterns 451ap, which are some among the plurality of first patterns 451a and 451b, may be disposed on the first surface of the base substrate, and the first patterns 451 bp, which are the others, may be disposed on the second surface of the base substrate. The second surface is a surface disposed at a relatively lower position than the first surface.

For example, when the base substrate has a single-layered structure, the first patterns 451ap may be disposed on the top surface of the base substrate, and the first patterns 451 bp may be disposed on the bottom surface of the base substrate. Also, when the base substrate has a multi-layered structure, the first patterns 451ap may be disposed on one surface among the top surface and the bottom surface of each layer, and the first patterns 451 bp may be disposed on another surface. For example, the first patterns 451ap may be disposed on a top surface or a bottom surface of a first layer of the base substrate having the multi-layered structure, and the first patterns 451 bp may be disposed on a top surface or a bottom surface of an n-th layer of the base substrate having the multi-layered structure (where, n is a natural number greater than one).

The first direction may be an upward and downward vibration direction of the voice coil plate. That is, the plurality of first patterns 451ap and 451 bp of the first pattern parts 451a and 451b may be arranged in the upward and downward vibration direction of the voice coil plate. Here, the first pattern parts 451a and 451b may be referred to as a vertical pattern part or a vertical coil part, and the plurality of first patterns 451ap and 451 bp of the first pattern parts 451a and 451b may be referred to as a plurality of first vertical patterns or a plurality of first vertical coils.

The second pattern parts 453a and 453b are formed on the base substrate (not shown) along a second direction. The second pattern parts 453a and 453b have a plurality of second patterns 453ap and 453bp. The plurality of second patterns 453ap and 453 bp are spaced apart at predetermined intervals from each other and disposed on the base substrate (not shown). The plurality of second patterns 453ap and 453 bp may be disposed in parallel.

The plurality of second patterns 453ap and 453 bp may be disposed on at least two different flat surfaces of the base substrate. For example, the second patterns 453ap, which are some among the plurality of second patterns 453ap and 453 bp, may be disposed on the first surface of the base substrate, and the second patterns 453 bp, which are the others, may be disposed on the second surface of the base substrate. The second surface is a surface disposed at a relatively lower position than the first surface.

For example, when the base substrate has a single-layered structure, the second patterns 453ap may be disposed on the top surface of the base substrate, and the second patterns 453 bp may be disposed on the bottom surface of the base substrate. Also, when the base substrate has a multi-layered structure, the second patterns 453ap may be disposed on one surface among the top surface and the bottom surface of each layer, and the second patterns 453 bp may be disposed on another surface. For example, the second patterns 453ap may be disposed on a top surface or a bottom surface of a first layer of the base substrate having the multi-layered structure, and the second patterns 453 bp may be disposed on a top surface or a bottom surface of an n-th layer of the base substrate having the multi-layered structure (where, n is a natural number greater than one).

The plurality of second patterns 453ap and 453 bp disposed on the at least two different flat surfaces are connected to the one of the connection parts 470, and one of the first patterns 451ap and 451 bp of the first pattern parts 451a and 451b is connected to one of the connection parts 470. Thus, the plurality of second patterns 453ap and 453 bp, which are disposed on the at least two different flat surfaces, are connected in parallel through one of the connection parts 470. For example, as illustrated in FIG. 14, two of the second patterns 453ap disposed on the first surface and two of the second patterns 453 bp disposed on the second surface may be connected in parallel to one of the connection part 470. Here, total four of the second patterns 453*ap* and 453*bp* are connected in parallel to one of the connection parts 470 in FIG. 14, but at least three or five of the second patterns 453*ap* and 453 *bp* may be connected in parallel to one of the connection parts 470.

The second direction may be a direction perpendicular to the upward and downward vibration direction of the voice coil plate. That is, the plurality of second patterns 453*ap* and 453 *bp* of the second pattern parts 453*a* and 453*b* may be arranged in a direction to perpendicular to the upward and downward vibration direction of the voice coil plate. Here, the second pattern parts 453*a* and 453*b* may be referred to as a horizontal pattern part or a horizontal coil part. The plurality of second patterns 453*ap* and 453 *bp* of the second pattern parts 453*a* and 453*b* may be referred to as a plurality of second horizontal patterns or a plurality of second horizontal coils.

In the voice coil plate having a multi-patterned coil for a slim speaker according to another embodiment of the present invention illustrated in FIG. 14, the plurality of second patterns 453*ap* and 453 *bp* are disposed on different flat surfaces as well as on the same flat surface of the base substrate. Thus, not only the effect of the voice coil plate of FIG. 1 but also the effect of the voice coil plate of FIG. 8 may be achieved. Particularly, the number of the second patterns to be disposed on one flat surface of the base substrate may be reduced by half when compared to FIG. 1, and the number of the flat surfaces on which the second patterns are to be disposed may be reduced by half when compared to FIG. 8.

FIG. 15 is an equivalent circuit for a portion of the voice coil 450 illustrated in FIGS. 14*a*-*b*.

Referring to FIG. 15, one of the first pattern part 451*a* or 451*b* is connected in parallel to the second pattern part 453*a* disposed on the first surface and the second pattern part 453*b* disposed on the second surface through the connection part 470. Two of the second patterns are connected in parallel in the second pattern part 453*a* disposed on the first surface, and two of the second patterns are also connected in parallel in the second pattern part 453*b* disposed on the second surface. Thus, total four of second patterns are connected in parallel to the connection part 470. Thus, the overall inductance value of the voice coil may be enhanced, and the overall impedance value may be reduced.

FIGS. 16 to 20 are perspective views of voice coil plates according to other embodiments of the present invention.

FIG. 16 is a perspective view of a voice coil plate according to another embodiment of the present invention, FIGS. 17*a*-*d* is an implementation diagram of a voice coil for each of layers of the voice coil plate illustrated in FIG. 16, and FIGS. 18 to 20 are modified examples of FIG. 16.

Referring to FIGS. 16 and 17*a*-*d*, in a flat panel speaker including a voice coil plate having a multi-layered structure, a voice coil, in which a first pattern part and a second pattern part have a spiral structure in the form of track, is formed in the voice coil plate as described above.

Particularly, the voice coil plate of the flat panel speaker illustrated in FIGS. 16 and 17*a*-*d* includes the voice coil plate having the multi-layered structure, and a helical or spiral-type voice coil covers all the layers and is made of a single line having one starting end and one terminating end. The starting end is connected to a (+) terminal, and the terminating end is connected to a (−) terminal.

Also, the voice coil in the form of track may be divided into a vertical pattern part 451 (a first pattern part) and a horizontal pattern part 453 (a second pattern part), and these pattern parts may be connected to each other to form a single helical or spiral shape.

As described in FIGS. 1 to 9, the vertical pattern part 451 may be a single voice coil line, and the horizontal pattern part 453 may be at least two voice coil lines.

A structure of the voice coil of the voice coil plate illustrated in FIGS. 16 and 17*a*-*d* will be described in detail.

Voice coil plates 510A, 510B, 510C, and 510D have a four-layered structure, and this may be a horizontal stacking or vertical stacking structure according to a direction of the speaker. A magnet and yoke (not shown) constituting a magnetic circuit are positioned on two sides of the voice coil plate, and a vibration plate (not shown) vibrating according to the up and down (or left and right) motion of the voice coil plate may be attached.

Voice coils may be formed on one surface or two surfaces of the voice coil plates 510A, 510B, 510C, and 510D, and each of the voice coils may have a helical track pattern with a single line.

Here, when the voice coil of each layer has a helical track pattern with a single line, a structure may be formed in which the voice coils are connected in parallel and in series to each other through a via-hole and the like. However, in the present invention, a case in which all the voice coils of layers have a helical track pattern structure with a single line may be constructed.

More particularly, when the voice coils are electrically connected to each other in the voice coil plates having a four-layered structure illustrated in FIG. 16, the helical track patterns having four lines are connected in series and parallel to each other through a via-hole in the related art, but the helical track pattern having a single line may be achieved in the present invention.

FIG. 16 illustrates only voice coils formed on the voice coil plates while not showing the voice coil plates, and the voice coils are illustrated which are vertically formed, on the voice coil plates having four layers, sequentially from the top to the bottom.

A voice coil 511A on the uppermost top layer, voice coils 511B and 511C on inner layers, and a voice coil 511D on the bottom layer are sequentially illustrated.

The voice coils are helical track patterns, and among the track patterns, a vertical pattern part 551 with respect to a width direction of the voice coil plate and a horizontal pattern part 553 with respect to a longitudinal direction thereof are connected to each other to form a single line.

First, horizontal pattern parts 553 may be formed on all the layers of the voice coil plates 510A, 510B, 510C, and 510D having first to fourth layers.

The horizontal pattern part 553 is a coil essentially required to maximize induced electromotive force for increasing efficiency of upward and downward vibration of the speaker. Also, implementation of the voice coil plate having a multi-layered structure is to form the voice coil on each of the coil plates and thus maximize the induced electromotive force.

Therefore, it is desirable that the horizontal pattern part 553 is formed on each of the layers. However, forming of the horizontal pattern parts 553 on some layers may be omitted in the present invention as necessary.

Since vertical pattern parts 551 vibrate upward and downward in a state in which the voice coil plates stand vertically, an electromotive force is induced in the left and right direction different from that of the upward and downward vibration of the speaker and thus is required to be minimized so as to efficiency of the speaker. A specific resistance value is increased as much as a line length of an unnecessary coil and line in the voice coil, and thus impedance of the speaker is increased unlike the inductance value. Therefore, the efficiency of the speaker is deteriorated.

Accordingly, the vertical pattern part 551 is necessary to form a helical or spiral pattern, and thus the vertical pattern part 551 is not required to be formed on all the layers.

Therefore, the present invention proposes a structure for increasing overall induced electromotive force of the speaker by forming the vertical pattern part 551 only on specific layers without forming the vertical pattern part 551 on all the layers.

Based on the above principle, the implementation of the flat panel speaker having a four-layered structure is illustrated as an example in FIGS. 16 and 17*a-d*.

In the horizontal pattern part 553, at least two lines are connected in parallel to each other (indicating that a plurality of horizontal patterns are connected in parallel to each other). Also, the connection to the horizontal pattern part 553 on another layer may be made through a via-hole 520.

In the first and fourth layers 511A and 511D of the first and fourth voice coil plates 510A and 510D, the voice coil is divided in the up and down direction and formed only with the horizontal pattern part 553, and a (+) terminal 530*a* and a (−) terminal 530*b* are formed.

In the second layer 511B of the second voice coil plate 510B, the horizontal pattern part 553 divided in the up and down direction is formed, and the vertical pattern part 551 is formed on the (+) terminal side. In the third layer 511C of the third voice coil plate 510C, the horizontal pattern part 553 divided in the up and down direction is formed, and the vertical pattern part 551 is formed on the (−) terminal side.

The vertical pattern part 551 on the (+) terminal side is formed on the second layer 511B, the vertical pattern part 551 on the (−) terminal side is formed on the third layer 511C, and a (−) terminal lead line 560 is formed on the second layer 511B.

Since via-holes 520 are formed at both ends of the horizontal pattern part 553 on each layer, the connection to the horizontal pattern part 553 on another layer and the connection to one vertical pattern part 551 are established through the via-holes 520.

Accordingly, the voice coils on the respective layers may have a helical structure having a single line.

In more detail, the outermost upper horizontal pattern 553*p* starting from the (+) terminal (the outermost voice coil line on the fourth layer is connected through the via-hole 520) is connected to the outermost (−) terminal side vertical pattern 551*p* formed on the third layer 511C. Also, the outermost lower horizontal pattern 553*p* (the outermost voice coil line on the fourth layer is connected through the via-hole 52) is connected to the inner (+) terminal side vertical pattern 551*p*. Then, the connections to the inner upper horizontal pattern 553*p*, the inner (−) terminal side vertical pattern 551*p*, are the inner upper horizontal pattern 553 are sequentially established in a continuous spiral shape. The end thereof is connected to lead line 560.

Thus, starting from the (+) terminal, the voice coils over all the layers may have a coil structure having a single line track form.

FIGS. 17*a-d* shows configurations of the voice coils formed on the voice coil plates 510A, 510B, 510C, and 510D having four layers.

Referring to FIG. 18, FIG. 18 is an modified example of FIG. 16 and illustrates a flat panel speaker including a voice coil plate having the same four-layered structure. A (+) terminal side vertical pattern part 651 is formed on a top layer instead of an inner layer, and a (−) terminal side vertical pattern part 651 is formed on a bottom surface instead of an inner layer.

Although not illustrated, in the four-layered structure illustrated in FIGS. 16 and 18, the vertical pattern parts 551 and 651 may be formed on one layer or may be respectively formed on different layers.

Referring to FIGS. 19 and 20, FIG. 19 shows a structure of a voice coil plate having three layers, and FIG. 20 shows a structure of a voice coil plate having five layers.

The three-layered structure shows an example of forming (+) terminal side and (−) terminal side vertical pattern parts 751 on an inner layer, and the five-layered structure shows an example of forming a (+) terminal side vertical pattern part 851 on a third layer and a (−) terminal side vertical pattern part 851 on a fourth layer.

As described above, the multi-layered structure of the flat panel speaker of the present invention may be applied to all the cases having at least two layers.

It is desirable to form only the horizontal pattern part on the surfaces of the top layer and the bottom layer so as to implement the present invention illustrated in FIGS. 16 to 20, and it is desirable to form the vertical pattern part on the inner layers so as to implement the spiral structure.

The entire voice coil is formed in the helical shape having the single line starting from the (+) terminal and terminating at the (−) terminal.

In a case of a structure of a voice coil plate having n layers, although a line width (L value) of a horizontal pattern part effective to driving the entire speaker increases n times, impedance of the entire system may be reduced to 1/n due to n parallel connection through the via-hole.

When a voice coil plate includes four layers, a vertical pattern part may be formed only on an inner layer, and spiral may be formed only with the ¼ number of vertical lines. When spiral is formed by dividing the vertical pattern part into a second layer and a third layer, the spiral may be formed only with the ⅛ number of vertical lines on one layer.

In this case, the number of vertical lines may be reduced to ¼ so as to reduce unnecessary patterns, and thus the system weight may be significantly reduced.

Also, when voice coils are formed on two surfaces of a voice coil plate instead of one surface, stacking of voice coil plates having four layers may be substantially equivalent to stacking of voice coil plates having eight layers. Although not shown, patterns in which the voice coils are formed on two surfaces may be possible through the same method as the pattern on one surface.

Also, since there is no actual pattern on the left and right sides of the surface of the top layer and the surface of the bottom layer, a space is secured. Thus, a terminal connection pattern may be located at any position, and the space may be used for other purposes.

The features, structures and effects, and the like described in the embodiments are included in one embodiment of the present invention and are not necessarily limited to one embodiment. Furthermore, the features, structures, effects, and the like exemplified in each embodiment can be combined or modified in other embodiments by those skilled in the art to which the embodiments belong. Therefore, contents related to the combination and modification should be construed to be included in the scope of the present disclosure.

Although embodiments of the present invention have been described above, these are just examples and do not limit the present invention. Further, the present invention may be modified and applied in various ways, without departing from the essential features of the embodiments, by those skilled in the art to which the present disclosure pertains. For example, the components described in detail in the embodiments of the present invention may be modified. Further, differences due to the modification and application should be construed as being included in the scope of the present invention as defined in the appended claims.

The invention claimed is:

1. A voice coil plate comprising:
a base substrate; and
a voice coil formed on one surface of the base substrate,
wherein the voice coil comprises a first pattern part arranged along a first direction and a second pattern part arranged along a second direction different from the first direction, the first direction being an upward and downward vibration direction of the voice coil plate, and the second direction being a direction perpendicular to the first direction,
wherein the first pattern part comprises a plurality of first patterns spaced apart at predetermined intervals, and
the second pattern part comprises a plurality of second patterns spaced apart at predetermined intervals,
wherein at least two of the second patterns, among the plurality of second patterns, are connected in parallel to one of the first patterns.

2. The voice coil plate of claim 1, wherein the voice coil is spirally printed on the one surface of the base substrate.

3. The voice coil plate of claim 1, wherein the base substrate has a single-layered structure, and the voice coil is disposed on each of a top surface and a bottom surface of the base substrate.

4. The voice coil plate of claim 1, wherein the base substrate has a multi-layered structure, and the voice coil is disposed on each of at least two surfaces among top surfaces and bottom surfaces of layers of the base substrate.

5. A voice coil plate comprising:
a base substrate having at least two different flat surfaces; and
a voice coil formed on the base substrate,
wherein the base substrate comprises a connection part disposed passing through the at least two different flat surfaces,
wherein the voice coil comprises a first pattern part arranged along a first direction and a second pattern part arranged along a second direction different from the first direction,
wherein the first pattern part comprises a first pattern formed on one surface among the at least two different flat surfaces of the base substrate, and
the second pattern part comprises a plurality of second patterns respectively disposed on the at least two different flat surfaces,
wherein the first pattern is connected to the connection part, and the plurality of second patterns are connected in parallel to the connection part.

6. The voice coil plate of claim 5, wherein the base substrate has a single-layered structure, and
the at least two different flat surfaces are a top surface and a bottom surface of the base substrate.

7. The voice coil plate of claim 5, wherein the base substrate has a multi-layered structure, and
the at least two different flat surfaces are top surfaces and bottom surface of layers of the base substrate.

8. The voice coil plate of claim 5, wherein the voice coil comprises a first voice coil and a second voice coil,
wherein the connection part of the base substrate comprises:
a first connection part disposed between the first pattern part and the second pattern part of the first voice coil;
a second connection part disposed between the first pattern part and the second pattern part of the second voice coil; and
a third connection part disposed between the first voice coil and the second voice coil.

9. The voice coil plate of claim 8, wherein the first connection part and the second connection part are alternately arranged along a third direction different from the first direction and the second direction.

10. The voice coil plate of claim 5, wherein the first direction is an upward and downward vibration direction of the voice coil plate, and
the second direction is a direction perpendicular to the first direction.

11. A voice coil plate comprising:
a base substrate having at least two different flat surfaces; and
a voice coil formed on the base substrate,
wherein the base substrate comprises a connection part disposed passing through the at least two different flat surfaces,
wherein the voice coil comprises a first pattern part arranged along a first direction and a second pattern part arranged along a second direction different from the first direction,
wherein the first pattern part comprises a first pattern formed on one surface among the at least two different flat surfaces of the base substrate, and
the second pattern part comprises a plurality of second patterns connected in parallel on each flat surface of the at least two different flat surfaces,
wherein the first pattern is connected to the connection part, and the plurality of the second patterns disposed on each flat surface are connected in parallel to the connection part.

12. A flat panel speaker comprising a multi-patterned voice coil and a voice coil plate having a multi-layered structure, the flat panel speaker comprising a voice coil plate on which a voice coil is formed,
wherein the voice coil plate has an even-numbered layer structure with at least four layers,
wherein the voice coil has a track shape in which a horizontal pattern part and a vertical pattern part are continuously wound from the outside to the inside,
wherein the horizontal pattern part comprises one or more horizontal patterns, the horizontal pattern part is formed over all the layers of the voice coil plate, and the horizontal patterns on the respective layers are connected in parallel to each other through one or more via-holes, and
the vertical pattern part is formed on one or more inner layers of the voice coil plate among the layers of the voice coil plate and is connected to the horizontal pattern part through the one or more via-holes.

13. The flat panel speaker of claim 12, wherein the voice coil is formed on one surface or two surfaces of the voice coil plate, and
the vertical pattern part is formed on one or more layers among the inner layers of the voice coil plate.

14. The flat panel speaker of claim 12, wherein the voice coil has a starting end and a terminating end, and a lead line connected to one terminal from the terminating end is formed on one layer of the voice coil plate which does not intersect with the vertical pattern part.

15. The flat panel speaker of claim 12, wherein the horizontal pattern part and the vertical pattern part comprise at least two voice coil lines,
the horizontal pattern part comprises a plurality of horizontal patterns in which at least two voice coil lines are connected in parallel,
the plurality of horizontal patterns and one voice coil line of the vertical pattern part are connected in series to each other, and
the voice coil lines of each of the horizontal pattern part and the vertical pattern part has the same line width.

16. The flat panel speaker of claim 12, wherein the vertical pattern part is formed on the left or right side of one inner layer of the voice coil plate among the layers of the voice coil plate and is formed on the right or left side of another inner layer, and the vertical pattern part on the left or right side for each layer is alternately repeated.

* * * * *